United States Patent
Makara et al.

(10) Patent No.: US 6,382,900 B1
(45) Date of Patent: May 7, 2002

(54) APPARATUS FOR CONVEYANCE OF SEMICONDUCTOR CHIPS

(75) Inventors: Chihiro Makara; Tetsuji Kadowaki, both of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/266,815

(22) Filed: Mar. 12, 1999

(30) Foreign Application Priority Data

Jun. 2, 1998 (JP) .......................................... 10-153188

(51) Int. Cl.$^7$ ............................................. B65G 11/00
(52) U.S. Cl. ........................ 414/749; 414/416; 414/477; 414/751.1; 414/752; 414/753; 414/744.6
(58) Field of Search ................................. 414/403, 416, 414/477, 749, 751.1, 752, 753, 744.6

(56) References Cited

U.S. PATENT DOCUMENTS

| | | | |
|---|---|---|---|
| 3,655,070 A | * 4/1972 | Haydu | 214/1 BB |
| 4,280,786 A | * 7/1981 | Dyche | 414/749 |
| 4,611,846 A | * 9/1986 | Feiber et al. | 294/88 |
| 5,198,736 A | * 3/1993 | Azuma et al. | 318/568.1 |
| 5,299,902 A | * 4/1994 | Fujiwara et al. | 414/716 |
| 5,310,301 A | * 5/1994 | Aono | 414/416 |
| 5,533,858 A | * 7/1996 | Costa | 414/751 |
| 5,725,140 A | * 3/1998 | Weber et al. | 226/139 |
| 5,738,481 A | * 4/1998 | Rogers | 414/744.6 |

* cited by examiner

*Primary Examiner*—Joseph A. Fischetti
(74) *Attorney, Agent, or Firm*—Armstrong, Westerman & Hattori, LLP.

(57) ABSTRACT

An apparatus for conveyance of a semiconductor chip. The apparatus includes an arm for conveying a semiconductor chip, a pickup on the arm for holding the semiconductor chip. A first transmission mechanism is provided for producing power acting in a first direction. The first transmission mechanism includes pulleys and a wire. An interconnection mechanism is provided for interconnecting the wire and the arm for causing movement of the arm in the first direction. A second transmission mechanism is connected to the arm for moving the arm in a second direction which is substantially orthogonal to the first direction. The interconnection mechanism is configured to permit movement of the arm with respect to the first transmission mechanism in the second direction and to transmit the power from the first transmission mechanism to the arm.

18 Claims, 26 Drawing Sheets

APPARATUS FOR CONVEYANCE OF SEMICONDUCTOR CHIPS

BACKGROUND OF THE INVENTION

The invention relates to an apparatus for conveyance, in particular, to an apparatus for conveyance which is preferred for use in the manufacture of semiconductor chips.

A semiconductor manufacturing system generally comprises a bonder, which conveys semiconductor chips, and a feeder, which is mechanically coupled to and coordinated with the bonder for coordinated motion therewith for feeding lead frames.

Reference is now made to FIGS. 1 to 9 to describe a bonder 100 and a feeder 140 used in the prior art. In the description to follow, the lateral direction of bonder 100 and feeder 140 is defined as the X-axis direction, while the fore-and-aft direction thereof is defined as the Y-axis direction.

The bonder 100 will be described first with reference to FIGS. 1 to 7. FIG. 1 is a top view, FIG. 2 a front view, FIG. 3 is a left-hand side elevation and FIG. 4 a right-hand side elevation of the bonder.

Referring to FIG. 1, the lower portion as viewed in FIG. 1 represents a front portion of the bonder 100 while the upper portion as viewed in FIG. 1 represents a rear portion of the bonder 100. The bonder 100 includes a box-shaped first base 101 and a drive motor 102 fixed to the first base 101. The motor 102 has an output shaft on which a disc cam 103 and a splined shaft 104 are mounted. A cylindrical cam 105 is mounted on the splined shaft 104 in an axially movable manner and includes a helical cam groove 105a.

Referring to FIG. 4, an arm 107 is connected to the cylindrical cam 105 through a cam follower 108, which is fixed to the arm 107 and is pressed into the cam groove 105a of the cylindrical cam 105. A horizontal guide 106 is mounted on the first base 101 for guiding movement of the arm 107. When the drive motor 102 is set in motion to rotate the cylindrical cam 105, the arm 107 is reciprocated by the cam follower 108 in the X-axis direction.

Referring to FIG. 3, a plurality of vertical guides 109 are mounted on the lateral surface of the first base 101, and a plate 110 connected to the vertical guides 109 is allowed to move in the vertical direction, or Z-axis direction. A rail 111 extending along the Y-axis direction is secured to the bottom of the plate 110. As shown in FIG. 2, a cam follower 113 is secured to the top of the plate 110 through a connecting plate 112. The cam follower 113 contacts the top of the disc cam 103. When the drive motor 102 rotates the disc cam 103, the plate 110 and the rail 111 are reciprocated by the cam follower 113 in the vertical direction.

Returning to FIG. 3, the arm 107 has a vertical guide 116 at one end, and a fastening member 115 fastens the vertical guide 116 and the rail 111. The vertical guide 116 guides movement of the fastening member 115 in the vertical direction and guides movement of the fastening member 115 in the Y-axis direction. A bonding head or pickup head 114 is fixed to the fastening member 115. When the drive motor 102 drives both the cylindrical cam 105 and the disc cam 103 for rotation simultaneously, the arm 107 moves in the Y-axis direction while the rail 111 moves in the vertical, or X-axis, direction. Accordingly, the pickup head 114 moves in the Y-axis direction in accordance with the movement of the arm 107 and moves in the vertical direction in accordance with the movement of the rail 111. In this manner, the pickup head 114 performs a series of mounting operations through these movements in the both directions.

Returning to FIG. 1, an inching motor 117 is fixed to the lateral surface of the first base 101 at a location below the drive motor 102. The inching motor 117 has an output shaft connected to a ball screw 118, which is threaded to a linear bushing 119. The linear bushing 119 slides along a shaft 120, which extends in the Y-axis direction. The linear bushing 119 carries a cam follower 121 (see FIG. 2), which bears against a disc portion 122, which is formed at one end of the cylindrical cam 105. When the motor 117 drives the ball screw 118, the linear bushing 119 and the cam follower 121 move in the Y-axis direction. As the cam follower 121 moves, the cylindrical cam 105 moves along the splined shaft 104. The movement of the cylindrical cam 105 is transmitted through the cam follower 121 to cause an inching motion of the arm 107 and the pickup head 114.

As shown in FIG. 2, a second base 124 is located below and supports the first base 101. Above the second base 124, a plurality of shafts 125 extend in the X-axis direction. A linear bushing 123 slides along these shafts 125. The first base 101 is movable in the X-axis direction along the shafts 125.

Another inching motor 126 is mounted on the second base 124 and has an output shaft having threads for engagement with the first base 101. When the motor 126 drives the threaded shaft, the first base 101 is moved in the X-axis direction. As the first base 101 moves, the pickup head 114 undergoes an inching motion in the X-axis direction.

Referring to FIGS. 5 to 7, the construction of the pickup head 114 will be described. FIG. 5 is a right-hand side elevation, FIG. 6 a top view and FIG. 7 a front view of the pickup head 114.

Referring to FIG. 5, the pickup head 114 is provided with a leveling regulating mechanism for adjusting the lower surface of a collet 127, which is used to hold a semiconductor chip in a horizontal plane. The pickup head 114 is constructed to a high structural rigidity with first to fourth metallic bodies 128 to 131. The first body 128 is connected to a second body 129, which is then connected to a third body 130, which is, in turn, connected to the fourth body 131. In each instance, the connection takes place by way of a screw 132, the tightening of which may be regulated to bring the lower surface of the collet 127 into a horizontal plane. The first body 128 is pivotal about a fulcrum A relative to the second body 129. As shown in FIG. 6, the second body 129 is pivotal about a fulcrum B relative to the third body 130. As shown in FIG. 7, the third body 130 is pivotal about a fulcrum C relative to the fourth body 131.

The bonder 100 causes the pickup head 114 to perform a series of normal mounting operations when the drive motor 102 is set in motion. The pickup head 114 undergoes an inching motion when the inching motors 117, 126 are set in motion, thus performing a fine adjustment of its position. Specifically, the position of the pickup head 114 when it picks up a semiconductor chip or when it loads a semiconductor chip on a lead frame is finely adjusted.

Referring now to FIGS. 8 and 9, the feeder 140 will be described. FIG. 8 is a side elevation of the feeder 140, and FIG. 9 is a plan view of an essential part of the feeder 140.

Referring to FIG. 8, the feeder 140 includes an actuator 133 extending in the X-axis direction and a carriage 134 mounted on top of the actuator 133. In response to the actuation of the actuator 133, the carriage 134 moves in the X-axis direction. The carriage 134 includes a damper 135 and an air cylinder 136 which drives the damper 135. Thus, the damper 135 is moved in the Y-axis direction when the air cylinder 136, is operated. The carriage 134 is fixed to a pipe bearer 137 formed by a plurality of interconnected sleeves and containing a piping, not shown, connected to the air cylinder 136.

As shown in FIG. 9, the air cylinder 136 has a rod 136a, which is connected to a linkage 138, which is, in turn, connected to an upper damper 135a (see FIG.8) of the damper 135. The upper damper 135a is rotatable about a rotary mechanism 139. When the rod 136a is driven, the upper damper 135a assumes a pivoted position as shown in phantom lines in FIG. 8, thus opening the damper 135. In this manner, the damper 135 is opened and closed in response to a movement of the air cylinder 136.

In operation, the damper 135 carries a lead frame, not shown, and the carriage 134 brings the lead frame to a given position. The bonder 100 mounts a semiconductor chip on the lead frame which is brought to the given position.

However, the speed with which the pickup head 114 of the bonder 100 is moved or the speed of conveyance cannot be increased for the following reasons:

(1) the arm 107 carries, at its front end, the vertical guide 116, which adds to the weight of the arm 107;

(2) the pickup head 144 is fixed on the fastening member 115, which connects the vertical guide 116 to the rail 111, thus increasing the weight of the movable assembly;

(3) when the pickup head 114 is to be moved in the Y-axis direction during a normal mounting operation, the arm 107 slides along the horizontal guide 106 while the fastening member 115 slides along the rail 111, thus presenting an increased frictional resistance;

(4) when the pickup head 114 is moved in the Y-axis direction by the inching motion, the linear bushing 119 slides along the shaft 120 while the cylindrical cam 105 slides along the splined shaft 104, thus presenting an increased frictional resistance;

(5) when the pickup head 114 is moved vertically during the normal mounting operation, the plate 110 slides along the vertical guide 109 while the fastening member 115 slides along the vertical guide 116, again presenting an increased frictional resistance; and (6) the first to the fourth bodies 128–131 are used for the pickup head 114 to allow the lower surface of the collet 127 to be brought into a horizontal plane. The high rigidity required for each of the bodies 128–131 necessarily increases their weight and adds to the weight of the pickup head 114.

On the other hand, the feeder 140 includes the carriage 134, which is provided with the air cylinder 136 to serve as a drive source for directly driving the damper 135, thus adding to the weight of the carriage 134. Consequently, the speed with which the damper 135 is moved or the speed of conveyance for the lead frames cannot be increased.

SUMMARY OF THE INVENTION

It is an object of the invention to provide an apparatus for conveyance and a semiconductor manufacturing system that permit an increase in the speed of conveyance.

To achieve the above objective, the present invention provides an apparatus for conveyance of a semiconductor chip, comprising: an arm for conveying a semiconductor chip; a holder member on the arm for holding the semiconductor chip; a first transmission mechanism for producing power acting in a first direction; an interconnection mechanism for interconnecting the first transmission mechanism and the arm for causing movement of the arm in the first direction; and a second transmission mechanism connected to the arm for moving the arm in a second direction which is substantially orthogonal to the first direction, wherein the interconnection mechanism is configured to permit movement of the arm with respect to the first transmission mechanism in the second direction and to transmit the power from the first transmission mechanism to the arm.

The present invention further provides a bonding head for conveying a semiconductor chip, comprising: a body; a collet supported by the body for holding a semiconductor chip; a pipe shaft for supporting the collet, wherein the body includes a through-opening extending vertically, for receiving the pipe shaft; and a regulation mechanism mounted on the body for regulating inclination of the collet, wherein the regulation mechanism including: a bearing received within the through-opening in a tiltable manner for supporting the pipe shaft; a support formed at the lower end of the through-opening for supporting part of the bearing; and a plurality of holding members for applying force to the bearing in mutually different directions at locations above the support for positioning the bearing.

The present invention provides a apparatus for conveyance comprising: a base extending along a particular conveying direction; a carriage that is movable on the base in the conveying direction; a first drive source for moving the carriage; a damper mounted on the carriage, the damper being and adapted to be selectively opened and closed for holding an article to be conveyed; a resilient member for urging the damper in a direction to close it; a second drive source on the base; and a transmission member for transmitting power from the second drive source to the resilient member to open the damper against the force the resilient member.

Other aspects and advantages of the invention will become apparent from the following description, taken in conjunction with the accompanying drawings, illustrating by way of example, the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Referring to FIGS. 10 to 27, a semiconductor manufacturing system according to one embodiment of the present invention will now be described. The semiconductor manufacturing system comprises a bonder 200, which conveys semiconductor chips, and a feeder 210, which conveys lead frames in a manner coordinated with the bonder 200. In the description to follow, the lateral direction of the bonder and the feeder 200, 210 is defined as the X-axis direction while the fore-and-aft direction is defined as Y-axis direction.

Figure 1:
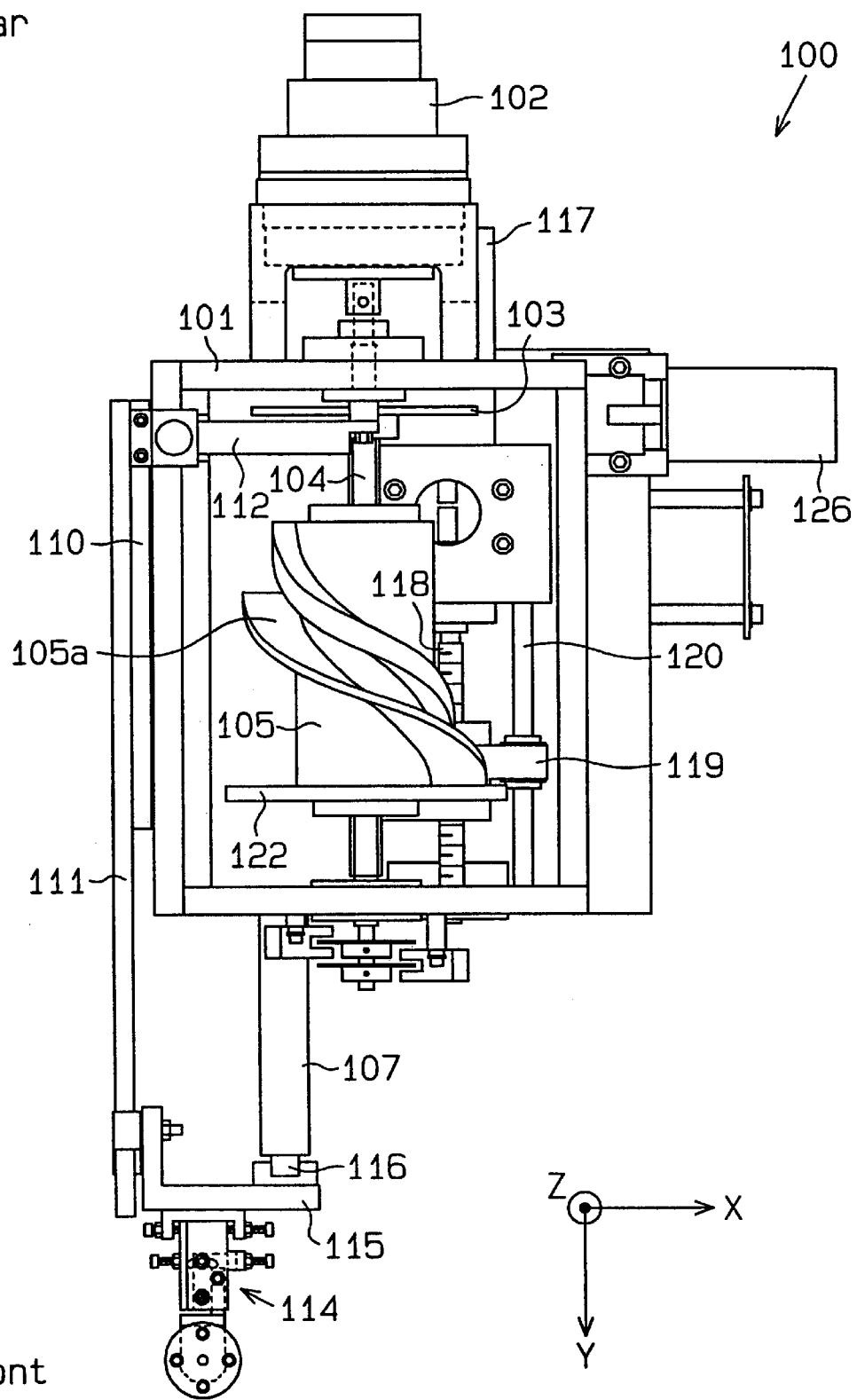
FIG. 1 is a plan view of a conventional bonder.
Figure 2:
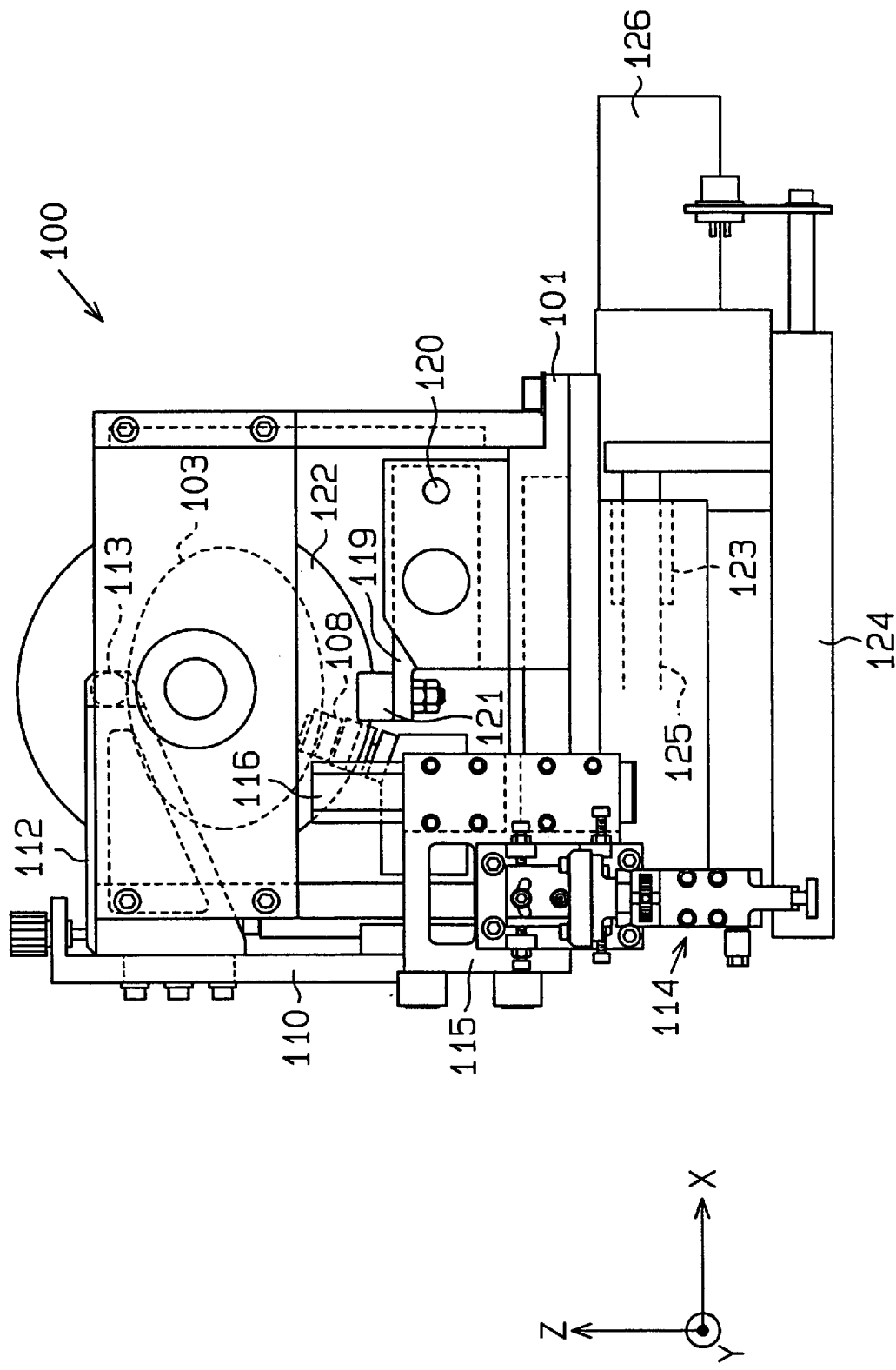
FIG. 2 is a front view of the bonder of FIG.1.
Figure 3:
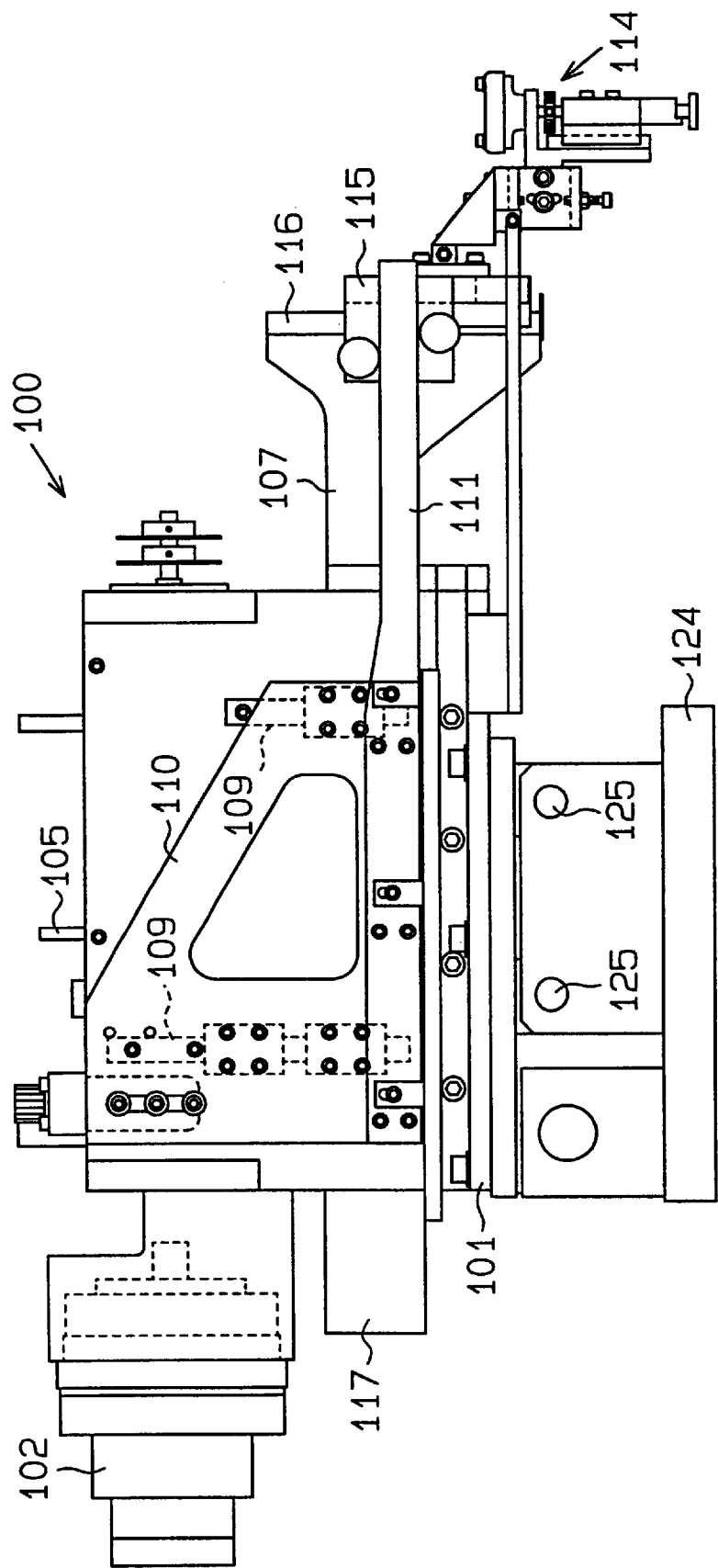
FIG. 3 is a left-hand side elevation of the bonder of FIG. 1.
Figure 4:
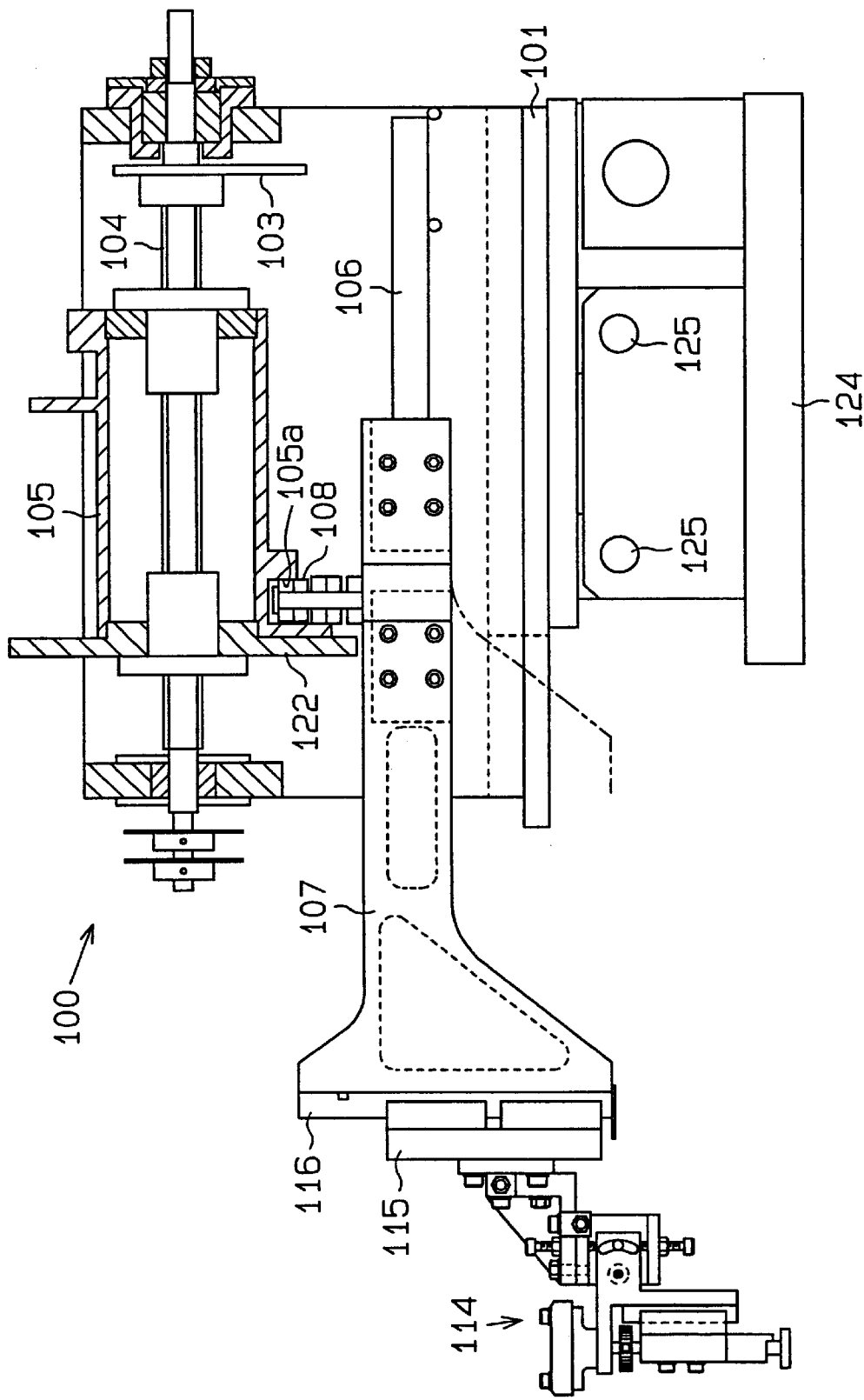
FIG. 4 is a right-hand side elevation of the bonder of FIG. 1.
Figure 5:
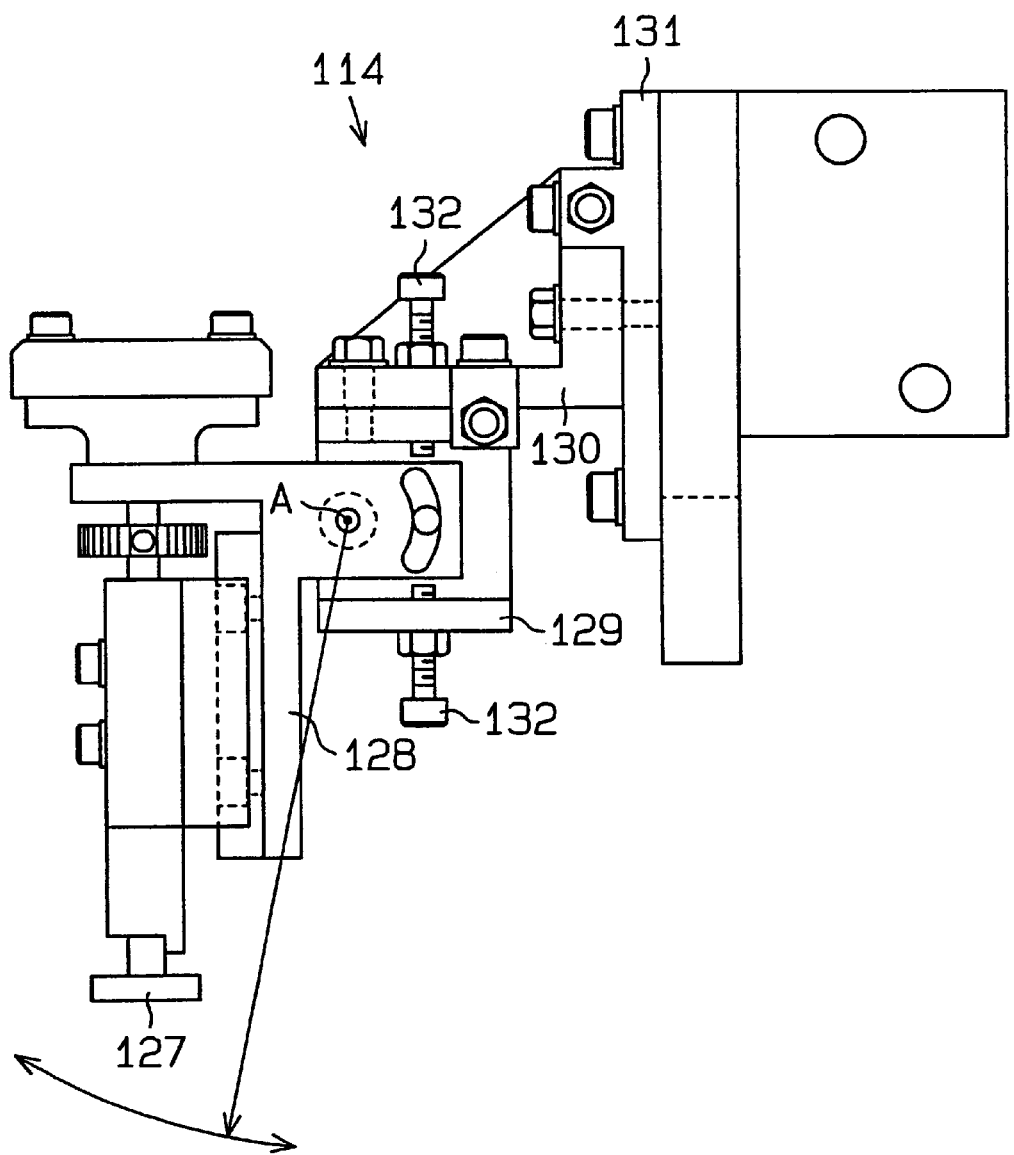
FIG. 5 is a right-hand side elevation of a pickup head of the bonder of FIG. 1.
Figure 6:
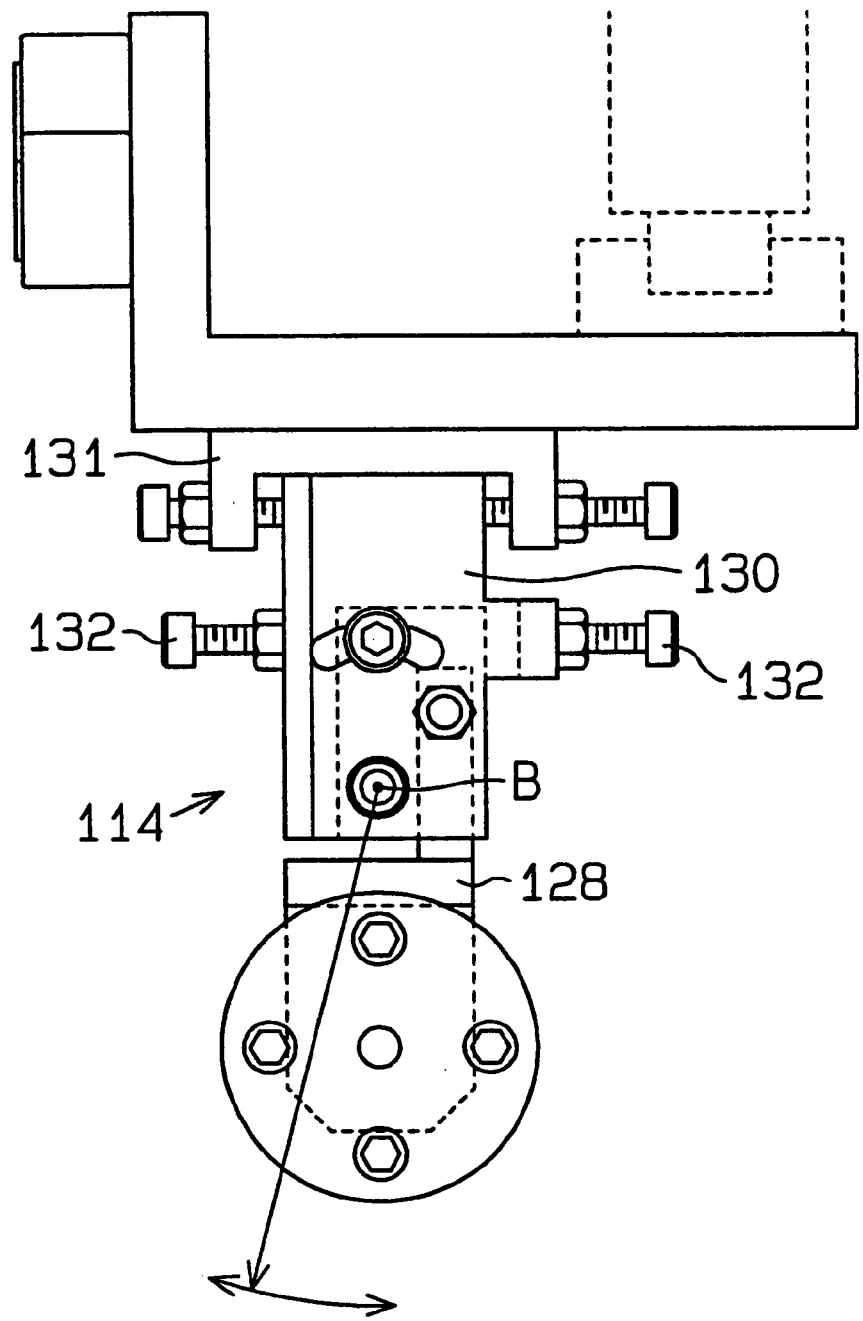
FIG. 6 is a plan view of the pickup head of FIG. 5.
Figure 7:
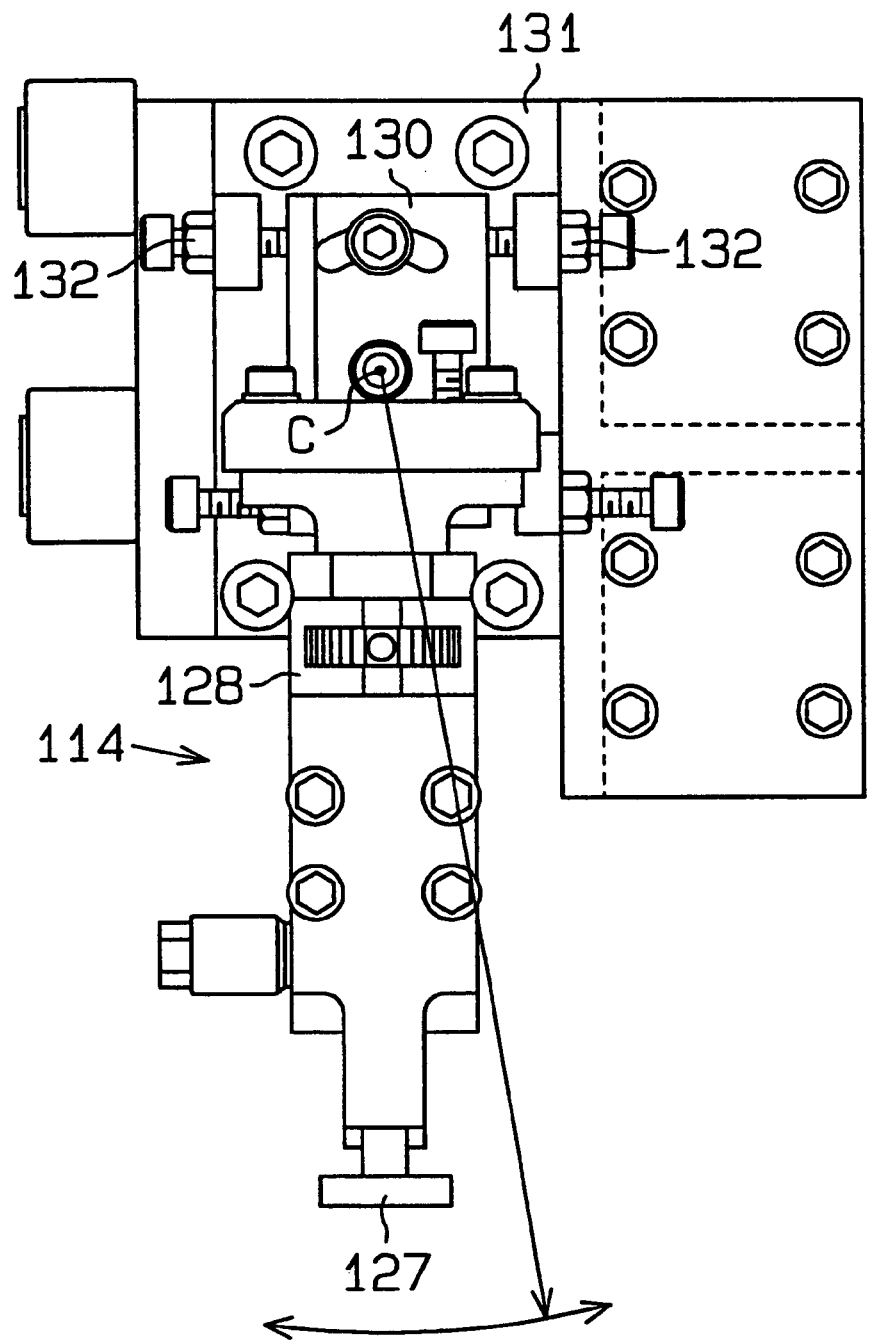
FIG. 7 is a front view of the pickup head of FIG. 5.
Figure 8:
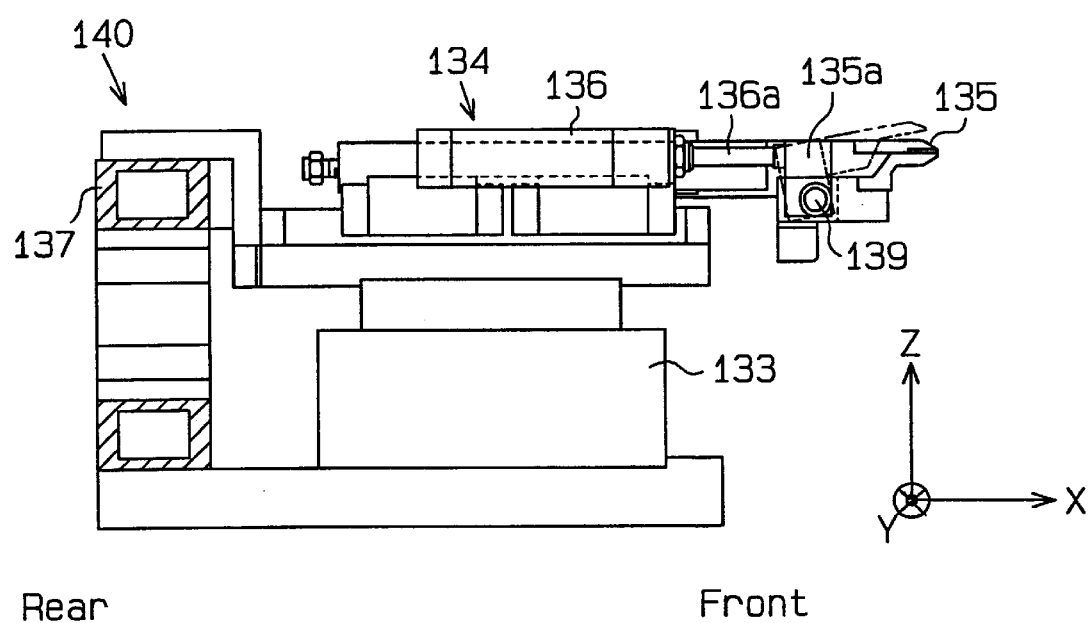
FIG. 8 is a left-hand side elevation of a conventional feeder.
Figure 9:
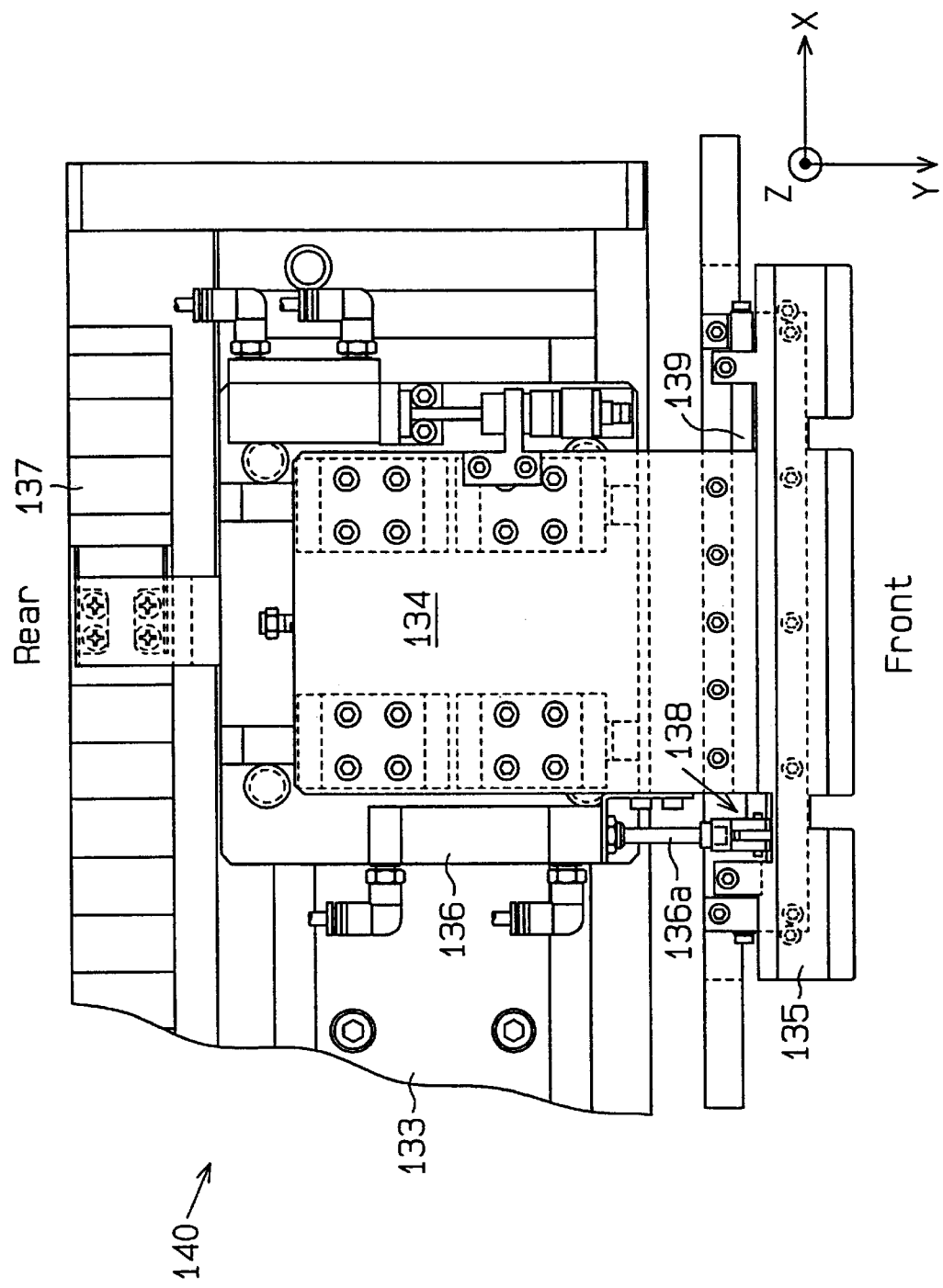
FIG. 9 is a plan view of an essential part of the feeder of FIG. 8.
Figure 10:
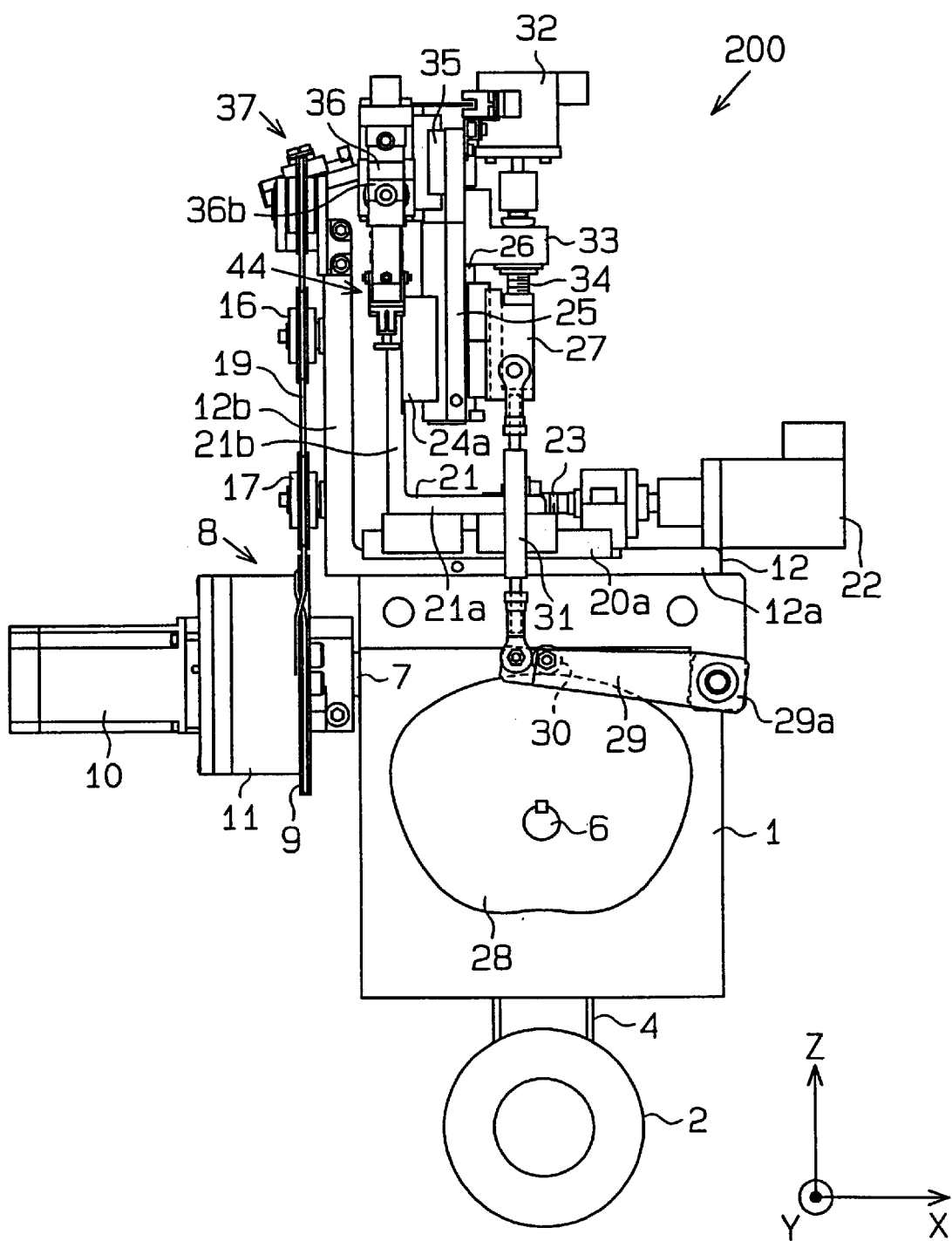
FIG. 10 is a front view of a bonder according to one embodiment of the present invention.
Figure 12:
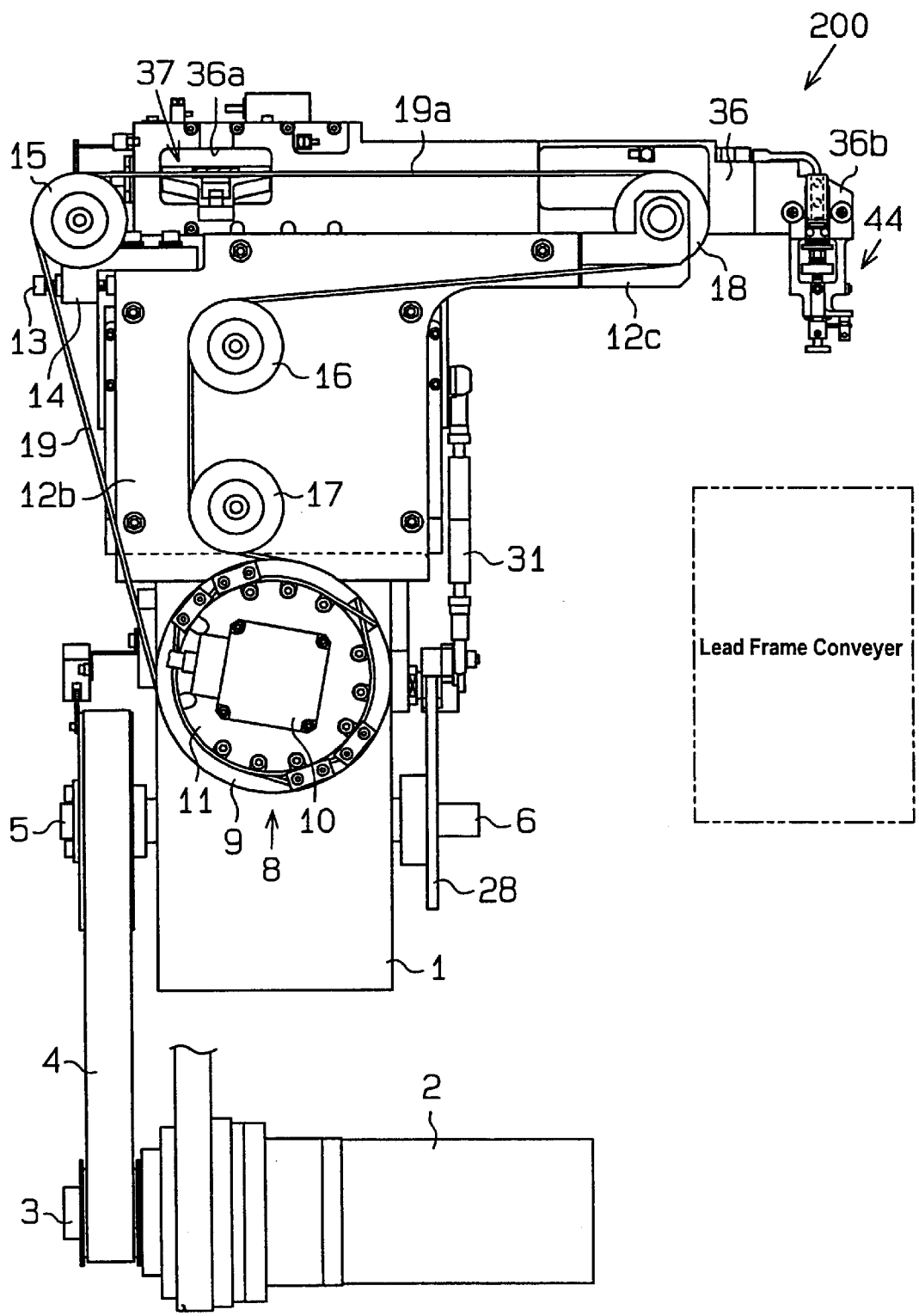
FIG. 12 is a left-hand side elevation of the bonder of FIG. 10.
Figure 13:
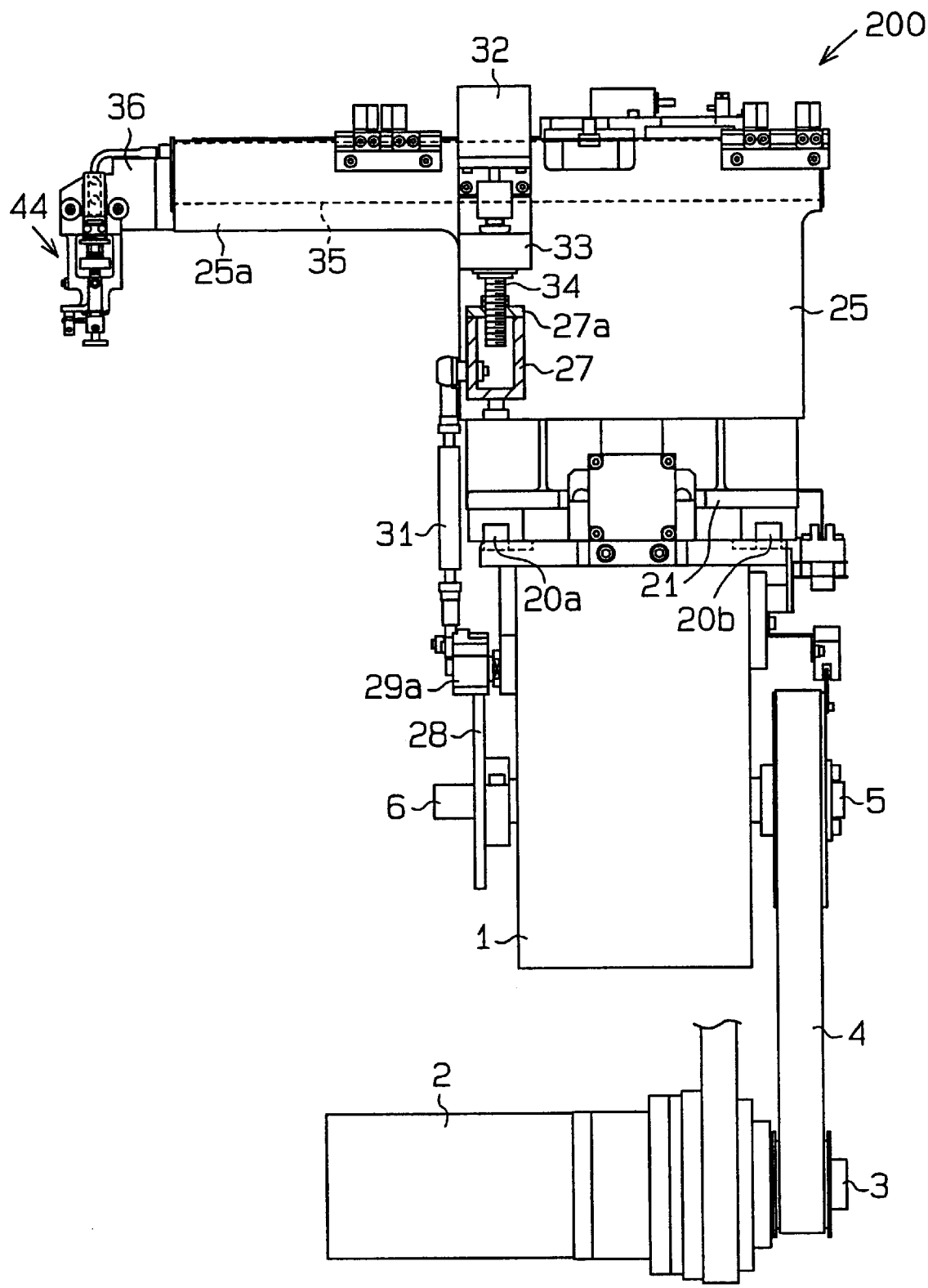
FIG. 13 is a cross sectional view of the bonder of FIG. 10 as seen from the right side of FIG. 10.

Referring to FIG. 10, the bonder 200 includes a cam unit 1 supported on a support frame, not shown. A drive motor 2 is located below the cam unit 1. As shown in FIGS. 12 and 13, the drive motor has an output shaft 3 coupled through a belt 4 with an input shaft 5, which projects from a rear part of the cam unit 1.

First and second input shafts 6, 7 (FIG. 10) are rotatably supported on the cam unit 1. The first output shaft 6 projects through the front surface of the cam unit 1 and rotates in an integral manner with the input shaft 5. The second output shaft 7 projects through the left lateral surface of the cam unit 1 and is connected to the input shaft 5 through a rotary conversion mechanism, not shown. As the input shaft 5 rotates in one direction, the second output shaft 7 repeats a clockwise and a counter-clockwise rotation through a given angular range.

The second output shaft 7 is connected to a drive pulley 9 through a conventional differential output mechanism 8. The differential output mechanism 8 includes an inching motor 10 and a reduction gearing 11. An output assembly from the reduction gearing 11 is connected to the second output shaft 7, and a casing of the inching motor 10 is fixed to the casing of the reduction gearing 11. The drive pulley 9 is located around the reduction gearing 11.

When the inching motor 10 is at rest, the second output shaft 7 and the drive pulley 9 rotate in an integral manner. However, when the inching motor 10 is activated, the drive pulley 9 rotates relative to the output assembly of the reduction gearing 11 or the second output shaft 7 by an amount corresponding to a difference between the angle of rotation of the output shaft of the motor 10 and the angle of rotation of the second output shaft 7.

A frame 12 is fixed to the upper surface of the cam unit 1 and includes a stationary portion 12a, which is secured to the upper surface of the cam unit 1, and a support wall 12b extending upwardly from the left side of the stationary portion 12a. Referring to FIG. 12, the frame 12 also includes an extension 12c, which extends forwardly from the top of the support wall 12b.

A movable block 14, which can be moved in the Y-axis direction by an adjustment of bolt 13, is mounted on the backside of the support wall 12b at its top, and a movable pulley 15 is rotatably supported on the movable block 14. A pair of vertically aligned stationary pulleys 16, 17 are rotatably supported on the support wall 12b substantially in its central region. In addition, a stationary pulley 18 is rotatably supported on the free end of the extension 12c. The movable pulley 15 and the stationary pulley 18 are located at the same elevation. A wire 19 extends around the drive pulley 9, the movable pulley 15 and the stationary pulleys 16 to 18, but the wire 19 may be replaced by a member such as a belt provided it is coupled to each of the pulleys 9 and 15 to 18 and is capable of transmitting power. The pulleys 9, 15–18 and the wire serves as first transmission mechanism. Torque from the drive pulley 9 is transmitted through the wire 19 to each of the pulleys 15 to 18, and a portion 19a of the wire 19 located between the movable pulley 15 and the stationary pulley 18 moves in the Y-axis direction. Tension in the wire 19 is adjusted by adjusting the position of the movable block 14.

Figure 11:
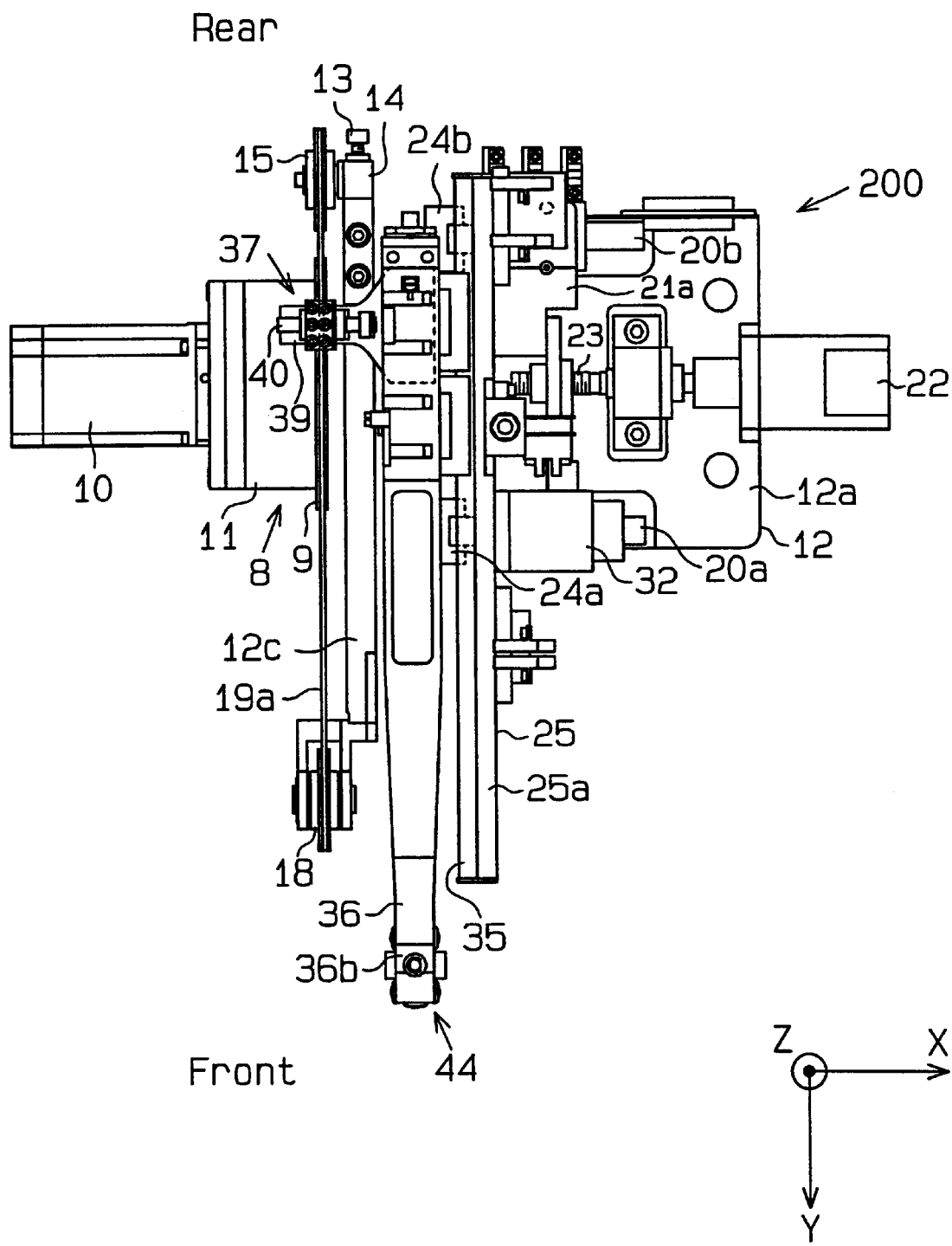
FIG. 11 is a plan view of the bonder, of FIG. 10.

Referring to FIGS. 10, 11 and 13, a pair of horizontal guides 20a, 20b which extend in the X-axis direction, are fixed to the upper surface of the stationary portion 12a. Each of the horizontal guides 20a, 20b is connected to an L-shaped plate 21 (FIG. 10) to be movable in the X-axis direction. Each of the L-shaped plates 21 includes a horizontal portion 21a, which moves over the horizontal guides 21a, 21b, and a vertical portion 21b, which extends upwardly from one end of the horizontal portion 21a.

As shown in FIG. 11, a drive motor 22 is fixed to the right end of the stationary portion 12a, and has an output shaft connected to a drive screw 23, which is in threaded engagement with the horizontal portion 21a of the L-shaped plate 21. When the drive motor 22 drives the screw 23, the threaded engagement causes the L-shaped plate 21 to be moved in the X-axis direction.

As shown in FIGS. 10 and 11, a pari of vertical guides 24a, 24b, which extend vertically, are located along the right-hand side ofthe vertical portion 21b of the L-shaped plate 21. A plate 25 is connected to the vertical guides 24a, 24b. The vertical guides 24a, 24b allow a vertical movement of the plate 25. The top of the plate 25 is formed with an extension 25a, which extends forwardly. A vertical guide 26 (FIG. 10), which extends vertically, is located along the right-hand side of the palate 25. A block 27 is connected to the vertical guide 26, which permits vertical movement of the block 27.

A disc cam 28 is fixed to the first output shaft 6 of the cam unit 1, and a lever 29 is located above the disc cam 28. The lever 29 has one end 29a that is supported to rotate with respect to the cam unit 1. The lever 29 has a free end on which a cam follower 30 is located for abutment against the outer periphery of the disc cam 28.

A rod-shaped link 31 has a lower end that is pivotally connected to the free end of the lever 29, and its upper end is connected to the block 27. When the first output shaft 6 rotates to cause rotation of the disc cam 28, the free end of the lever 29 moves vertically, whereby the block 27 is driven through the link 31 to move vertically. The disc cam 28, the lever 29, the link 31, the block 27 serves as second transmission mechanism.

Referring to FIG. 13, an inching motor 32 and a support 33 are fixed to the plate 25 at a location above the block 27. The inching motor 32 has an output shaft, which is connected through the support 33 to a drive screw 34. In this manner, the support 33 rotatably supports the output shaft of the motor 32. The drive screw 34 has threads that engage with a top cover 27a of the block 27. When the inching motor 32 remains at rest, a constant distance is maintained between the block 27 and the support 33. By contrast, when the inching motor 32 drives the screw 34, the threaded engagement adjusts the distance between the block 27 and the support 33. Accordingly, the block 27 moves relative to the plate 25.

Referring to FIGS. 10, 11 and 13, a horizontal guide 35 is located along the left-hand side of the plate 25 at its top and extends from the rear end of the plate 25 to the free end of the extension 25a. An arm 36, which extends in the Y-axis direction is, connected to the horizontal guide 35, which allows movement of the arm 36 in the Y-axis direction. As the plate 25 moves, the arm 36 is moved in the vertical direction.

Figure 14:
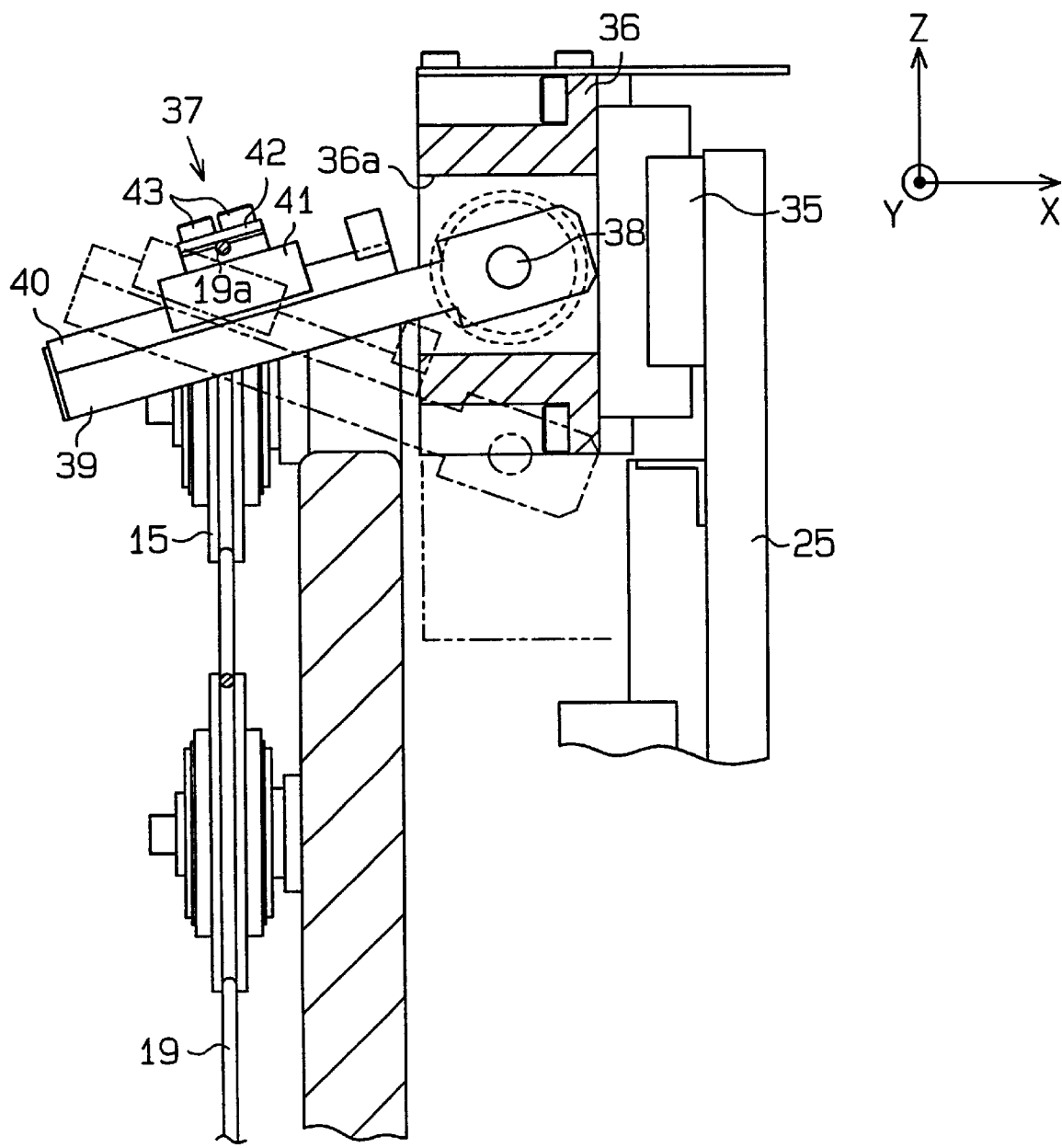
FIG. 14 is a cross sectional view of an essential part of the bonder shown of FIG. 10.

The arm 36 is connected to the wire 19 through an interconnection mechanism 37. The wire 19 is used to cause reciprocatory motion of the arm 36 in the Y-axis direction. Specifically, the rear end of the arm 36 is formed with a containing portion 36a (FIG. 12) which is open toward its left lateral surface. As shown in FIG. 14, a support shaft 38 which extends in the Y-axis direction is located within the containing portion 36a and is connected with a swinging lever 39, which is swingable about the axis of the support shaft 38.

Located on the swinging lever 39 is a displacement absorbing guide 40, which extends along the swinging lever 39 and which also extends in a radial direction to the support shaft 38. A connecting member 41 is placed on the displacement absorbing guide 40 in a movable manner. A wire holding plate 42 is secured to the upper surface of the connecting member 41 by a screw 43, and the wire 19a is sandwiched between the upper surface of the connecting member 41 and the wire holding plate 42.

When the arm 36 is displaced in the X-axis direction with respect to the wire 19a, the displacement absorbing guide 40 moves along the connecting member 41. When the arm 36 is displaced in the Z-axis direction with respect to the wire 19a, the swinging lever 39 swings about the support shaft 38, as shown in double-dashed phantom lines in FIG. 14, while the displacement absorbing guide 40 moves along the connecting member 41. As the wire 19a moves in the Y-axis direction, its power is transmitted to the arm 36 through the displacement absorbing guide 40 and the swinging lever 39, with the result that the arm 36 moves in the Y-axis direction. In this manner, the interconnection mechanism 37 allows displacement of the arm 36 in both the vertical direction and the X-axis direction with respect to the wire 19a and also transmits the power from the wire 19a, which acts in the Y-axis direction, to the arm 36. Consequently, a reciprocatory motion of the wire 19a in the Y-axis direction causes a corresponding reciprocatory motion of the arm 36 in the Y-axis direction.

Figure 15:
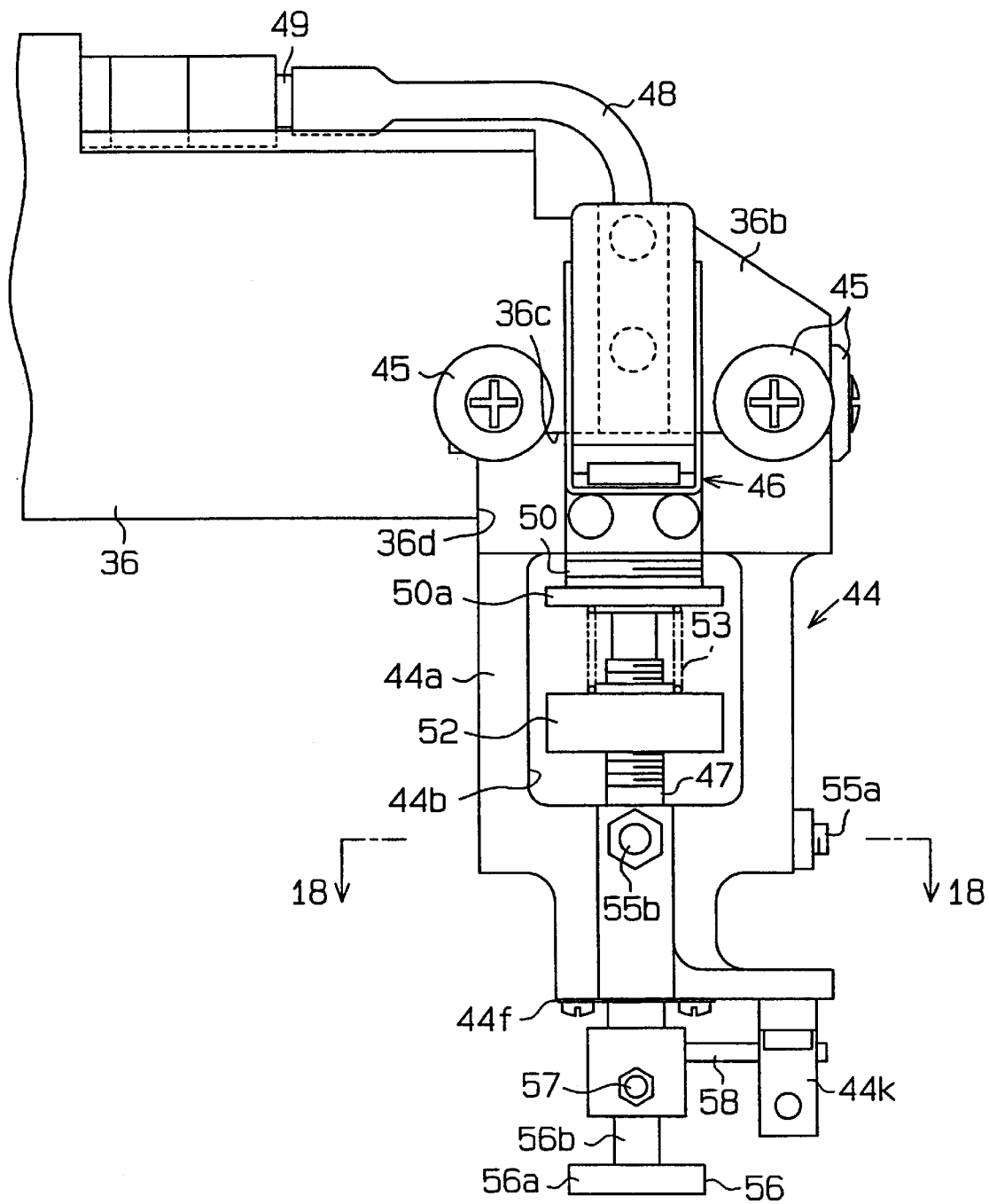
FIG. 15 is a left-hand side elevation of a pickup head of the bonder of FIG. 10.
Figure 16:
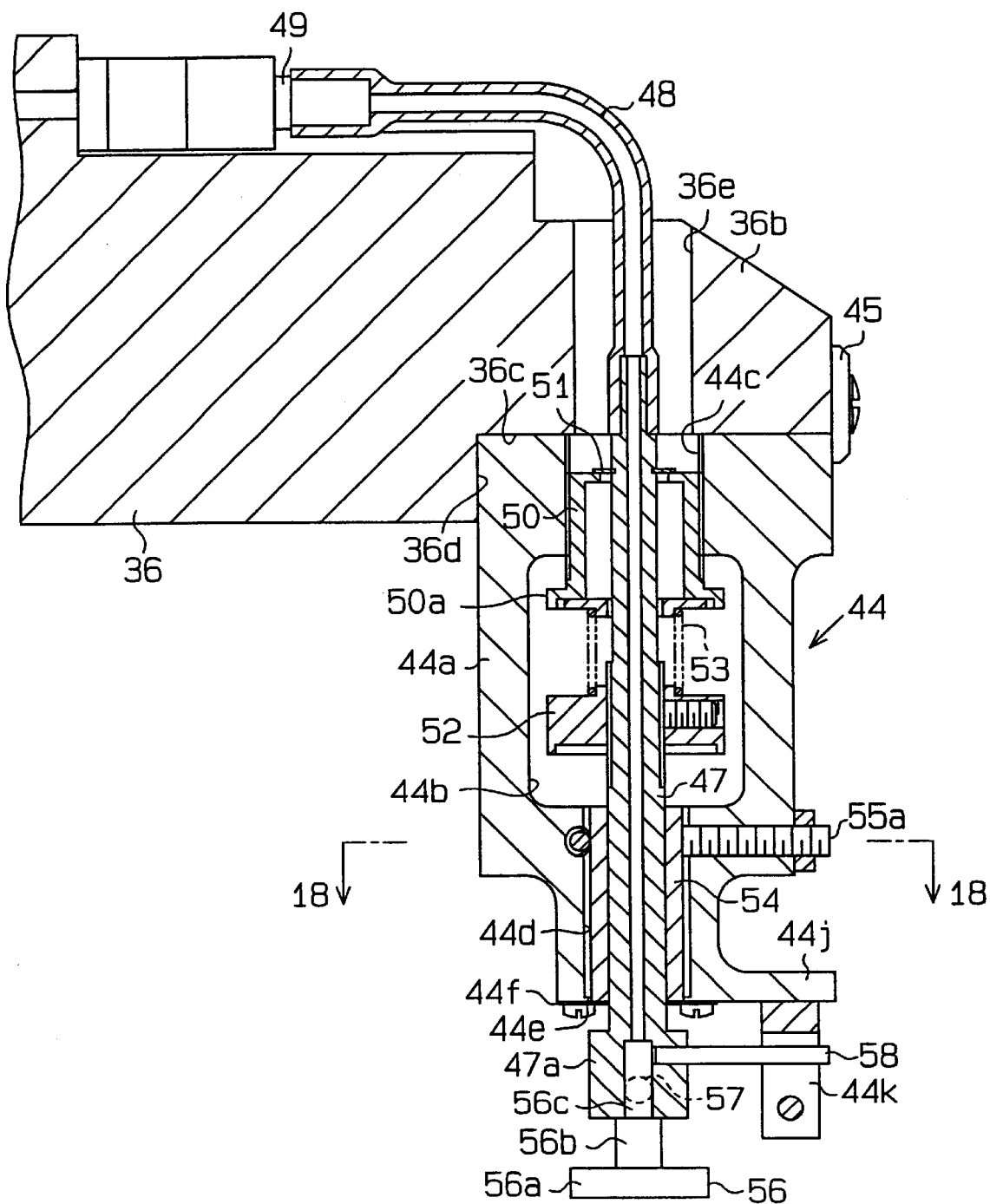
FIG. 16 is a cross sectional view taken along line 16—16 of FIG. 17.
Figure 17:
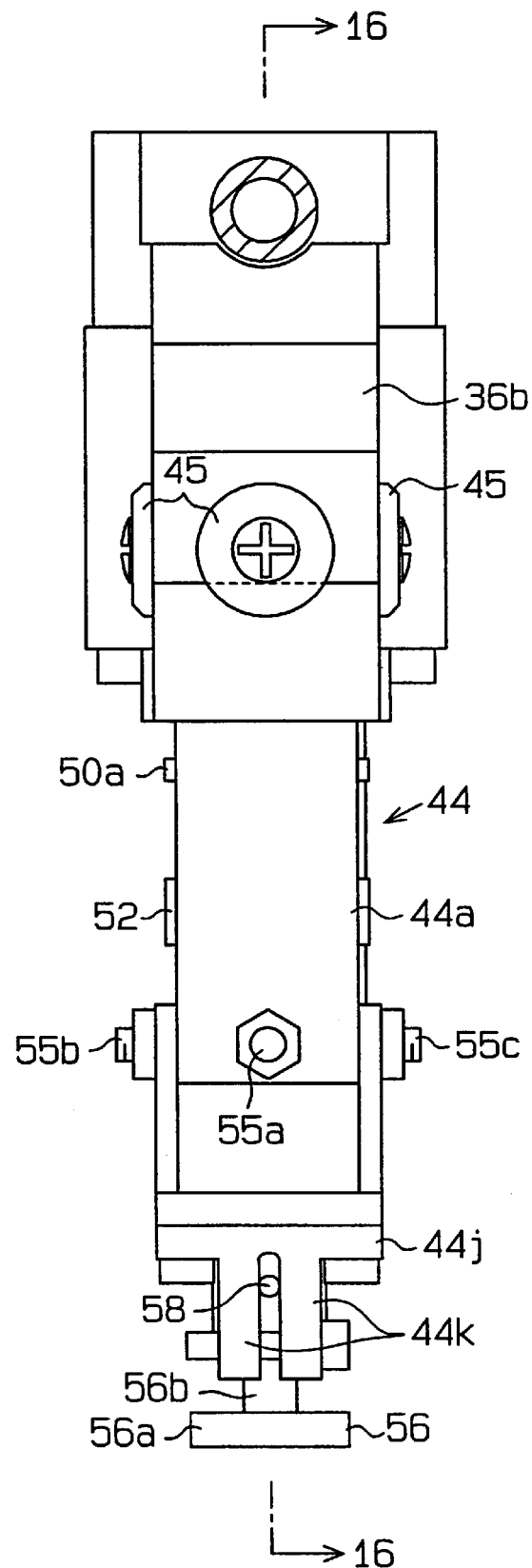
FIG. 17 is a front view of the pickup head of FIG. 15.

A pickup head 44 is secured to the front end 36b of the arm 36. Specifically, the front end 36b of the arm 36 is formed with a horizontal mounting surface 36c and a vertical mounting surface 36d, as shown in FIG. 16. The horizontal mounting surface 36c represents the lower surface of the front end 36b, which is substantially centrally formed with a vertically extending through-opening 36e. The configuration of the horizontal mounting surface 36c conforms to the upper surface of a body 44a of the pickup head 44. The body 44a comprises a single member. As shown in FIG. 15, the front end 36b and the pickup head 44 are secured together by means of a clamping member 46. At this time, the upper surface and one lateral surface of the body 44a contact the horizontal mounting surface 36c and the vertical mounting surface 36d, respectively. The other lateral surface of the body 44a contacts a washer 45, which is secured to the lateral surface of the front end 36b.

Referring to FIG. 16 again, the body 44a of the pickup head 44 is formed with a through-opening 44b which extends in the X-axis direction, and a threaded opening 44c (FIG. 16), which allows communication between the through-opening 44b and the through-opening 36e in the arm 36. In addition, the body 44a is formed with a holding opening 44d, which extends downward from the through-opening 44b.

A pipe shaft 47 is located in the body 44a to extend through the threaded opening 44c and through the holding opening 44d. The upper end of the pipe shaft 47 is connected to a vacuum hose 48 extending through the through-opening 36e. The vacuum hose 48 is connected to a suction pipe 49, which is located on top of the arm 36.

A tubular elevation adjusting screw 50 is threaded into the threaded opening 44c and has an internal diameter that is greater than the external diameter of the pipe shaft 17, thus allowing the pipe shaft 47 to extend through the adjusting screw 50. An adjustment area 50a is formed on the bottom of the adjusting screw 50 and is located within the through-opening 44b. A stop 51 is secured to the top of the pipe shaft 47 and abuts against the upper end face of the adjusting screw 50, thereby restricting the downward movement of the pipe shaft 47 in the engaged position between the stop 51 and the adjusting screw 50 while permitting the upward movement of the pipe shaft 47. The position of the pipe shaft 47, which is controlled in this manner, can be regulated by changing the relative position of the adjusting screw 50 with respect to the body 44a.

Threads are formed in a portion of the pipe shaft 47 located within the through-opening 44b. The threads engage with a disc-shaped pressure regulating screw 52, and a compressed spring 53 located between the upper surface of the pressure regulating screw 52 and the lower end of the elevation adjusting screw 50. The pipe shaft 47 is urged by the spring 53 downward relative to the elevation adjusting screw 50. In this manner, the pipe shaft 47 is maintained in a position where the stop 51 abuts against the elevation adjusting screw 50. As the pressure regulating screw 52 is turned, the spacing of the pressure regulating screw 52 from the elevation adjusting screw 50 is changed, thus adjusting the force with which the pipe shaft 47 is urged by the spring 53.

At its lowermost position, the inner peripheral surface of the holding opening 44d is formed with a rib 44e, which is very thin. A tubular bearing 54 is received within the holding opening 44d. The bearing 54 has an external diameter that is substantially equal to the internal diameter of the rib 44e, and the outer periphery of the bearing at its lower end is in contact with the inner periphery of the rib 44e. The lower end of the bearing 54 is held by a plate 44f having an internal diameter that substantially coincides with the external diameter of the pipe shaft 47, thus allowing the bearing 54 to tilt about the inner periphery of the rib 44e, which serves as a fulcrum. The bearing 54 supports the pipe shaft 47 in a slidable manner.

Figure 18:
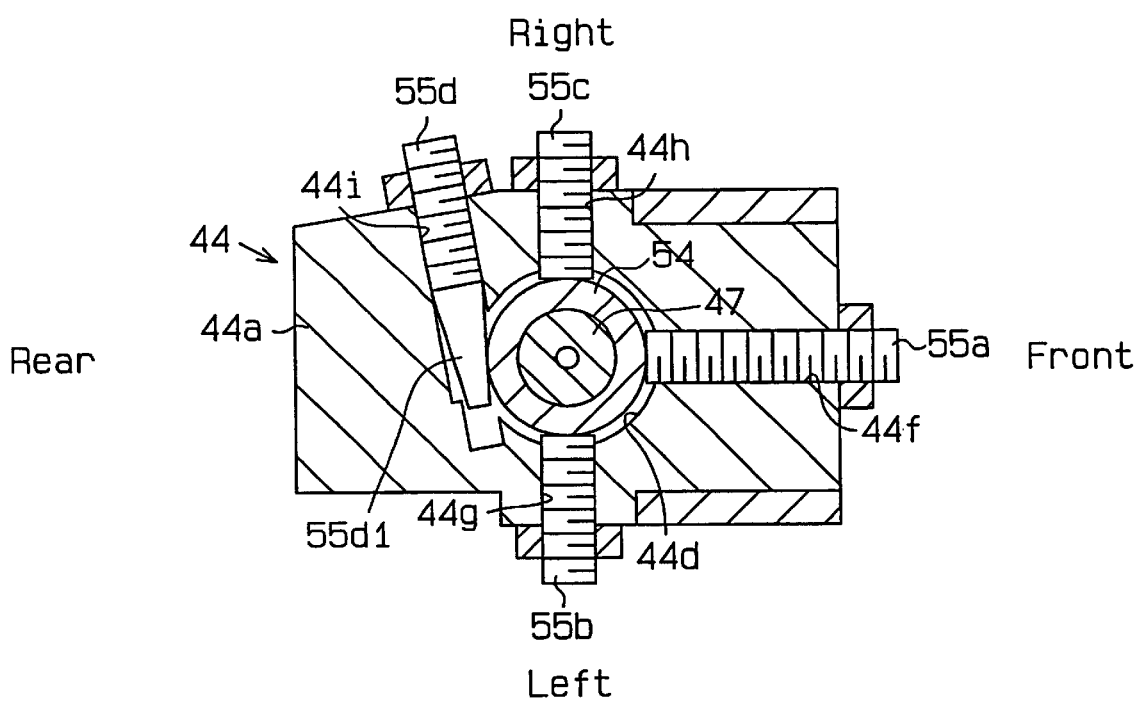
FIG. 18 is a cross sectional view taken along line 18—18 of FIG. 16.

Tilt regulating screws 55a–55d are threaded to an upper portion of the holding opening 44d to hold the bearing 54 at any desired angle. Specifically, the body 44a is formed with four threaded openings 44f–44i, which communicate with the holding opening 44d, as shown in FIG. 18, and the threaded openings 44f–44i receive the regulating screws 55a–55d, respectively. The regulating screws 55a–55d abut against the bearing 54 substantially at an equal angular intervals. The threaded openings 44f–44h extend radially from the centrally located holding opening 44d in a forward direction, to the left and to the right, respectively, while the threaded opening 44i extends rearwardly and obliquely to the right. The regulating screw 55d has a conical abutment 55d1 at its free end. Three regulating screws 55a–55c abut against the bearing 54 at their respective free ends, while the regulating screw 55d abuts against the bearing 54 with a bevelled surface defined by the conical abutment 55d1. A desired angle of tilting, which the pipe shaft 47 and the bearing 54 form with respect to the rib 44e, can be established by regulating the degree of tightening of the regulating screws 55a–55d.

Returning to FIG. 16, a collet 56 is supported at the lower end of the pipe shaft 47. Specifically, the bottom of the pipe shaft 47 is formed with a support 47a in which the collet 56 is to be mounted. The support 47a has an internal and an external diameter, which are greater than the internal and the external diameter of the pipe shaft 47, respectively. The collet 56 comprises a lower part 56a having an attracting surface, not shown, on its lower surface, a cylindrical upper part 56b, which extends upwardly from the lower part 56a, and a cylindrical connector 56c, which extends further upward from the upper part 56b. The connector 56c of the collet 56 is fitted into an opening in the support 47a of the pipe shaft 47 and is then secured by a screw 57. When the degree of tightening the respective regulating screws 55a–55d is adjusted, the leveling degree of the collet 56 is adjusted in accordance with the tilt angle of the pipe shaft 47.

The bottom of the body 44a is formed with a projection 44j, which projects forwardly and which carries a pair of downwardly extending guide pieces 44k (FIG. 17) at its free end. A pin 58 having a free end for contacting the guide pieces 44k is secured to the support 47a. Accordingly, the pipe shaft 47 and the collet 56 are vertically guided along the guide pieces 44k without undergoing any rotation.

Figure 19:
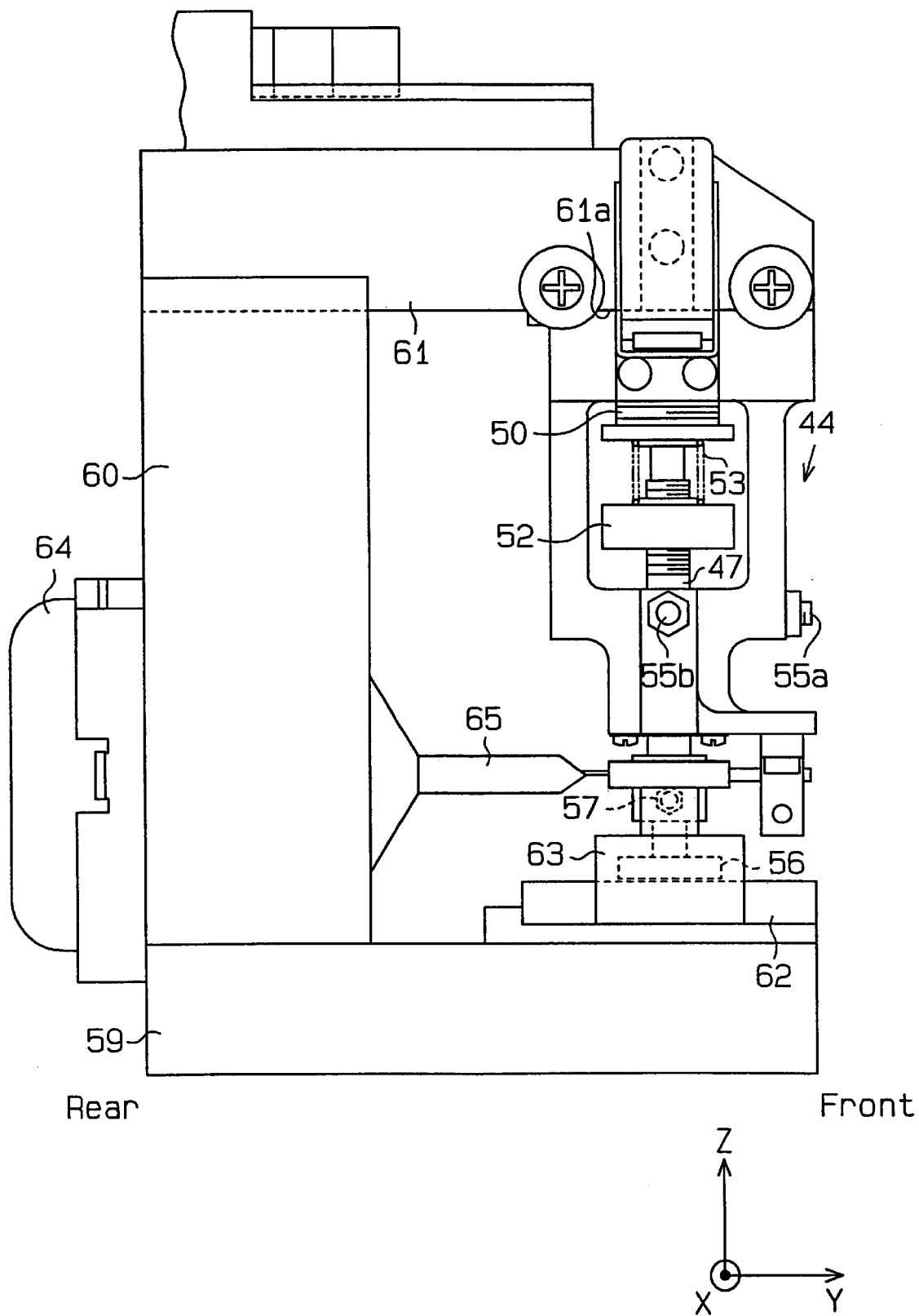
FIG. 19 is a left-hand side elevation of a regulating jig.
Figure 20:
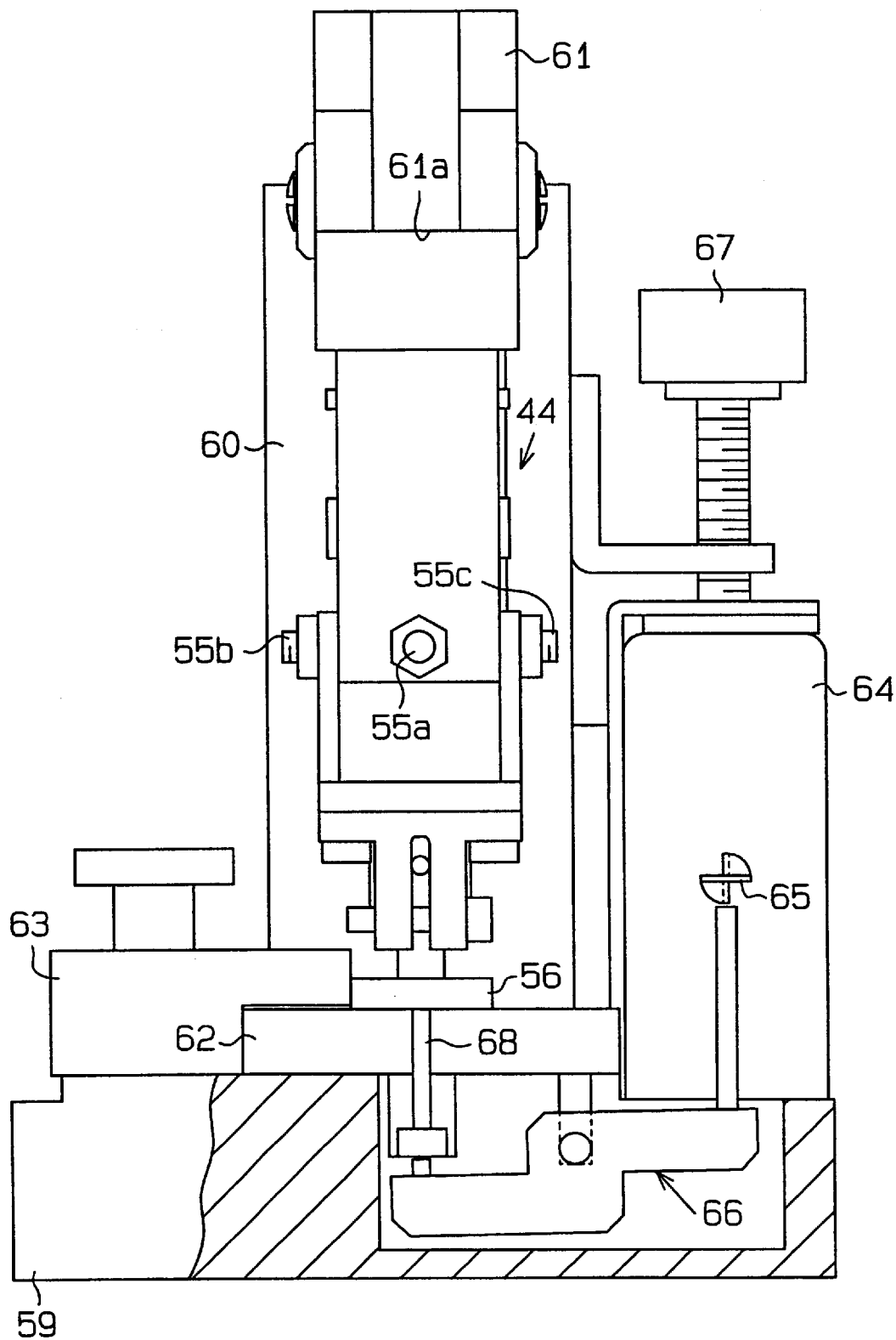
FIG. 20 is a front view of the regulating jig of FIG. 19.
Figure 21:
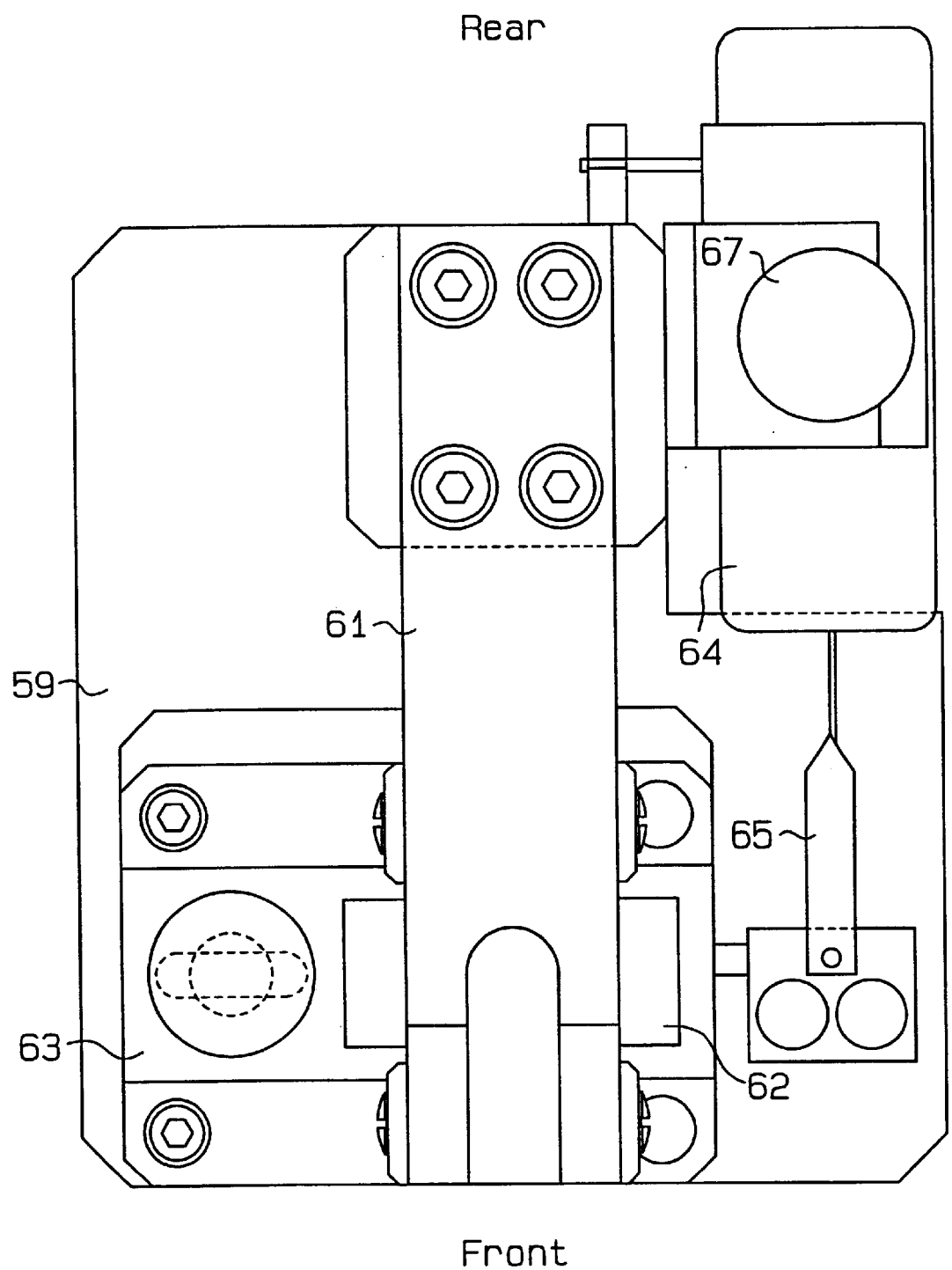
FIG. 21 is a plan view of the regulating jig of FIG. 19.

Referring now to FIGS. 19 to 21, a regulating jig 220 used to regulate various parts of the pickup head 44 will be described. As shown in FIG. 19, the regulating jig 220 includes a base 59, a stanchion 60, which is fixed to a rear portion of the base 59, and an arm 61 extending forwardly from the top of the stanchion 60.

The arm 61 is configured in substantially the same manner as the front end 36b of the arm 36 of the bonder 200 and has a horizontal mounting surface 61a on which the pickup head 44 to be regulated is secured.

An adjusting table 62 is located on the front end of the base 59. The adjusting table 62 has an upper surface that is parallel to the horizontal mounting surface 61a of the arm 61. A distance between the upper surface of the adjusting table 62 and the horizontal mounting surface 61a of the arm 61 is set to be equal to a distance that is used in performing the mounting operation when the pickup head 44 is secured to the bonder 200.

Referring to FIG. 20, a regulation block 63, which is movable in the X-axis direction, is located on the base 59 at a location toward the left side thereof, or forwardly, and the right lateral surface of the regulating block 63 runs orthogonally to the X-axis.

A tension gauge 64 is located on the base 59, toward its right side, or rearwardly, and has a measuring shaft 65 connected to a balance mechanism 66 located within the base 59. The balance mechanism 66 includes a push-up pin 68, which abuts against the collet 56. The tension gauge 64 determines the pressure acting on the collet 56 as it is pushed up by the pin 68, by screwing an adjust bolt 67.

To regulate the leveling degree of the collet 56, the collet 56 of the pickup head 44 is abutted against the upper surface of the adjusting table 62. Under this condition, individual tilting adjusting screws 55a–55d are adjusted, thus regulating the leveling degree of the collet 56 with a high precision. To regulate the angular position of the collet 56 around the pipe shaft 47, the collet 56 is abutted against the upper surface of the adjusting table 62 while the holding screw 57 for the pickup head 44 is loosened. The regulation block 63 is moved so that the right lateral surface of the regulation block 63 abuts against the left lateral surface of the collet 56. The angular position of the collet 56 around the pipe shaft 47 is adjusted while the collet 56 is held by the adjusting table 62 and the regulation block 63.

To adjust the force of the spring 53 that urges the pipe shaft 47 and hence the collet 56, the adjust bolt is turned while maintaining the collet 56 of the pickup head 44 in abutment against the upper surface of the adjusting table 62. In this manner, the force of the spring 53 acting on the collet 56 is determined by the tension gauge 64. By adjusting the pressure regulating screw 52 with reference to a value read from the tension gauge, the force of the spring 53 that acts on the collet 56 is set up to a desired value.

The operation of the bonder 200 will now be described. Referring to FIG. 13, when the drive motor 2 is rotated, the first output shaft 6 and the disc cam 28 are rotated. The rotating motion of the disc cam 28 is translated through the link 31 into vertical motion of the block 27, which accompanies vertical motion of the plate 25 and the arm 36.

Referring to FIG. 12, when the drive motor 2 is set in motion, the second output shaft 7 alternatively rotates through a given angular range in the clockwise and the counter-clockwise directions. As the second output shaft 7 rotates, the drive pulley 9 rotates in an integral manner. The rotation of the drive pulley 9 produces a reciprocation of the wire 19a located between the movable pulley 15 and the stationary pulley 18 in the Y-axis direction, and reciprocattion of the wire 19a produces a reciprocatory motion in the Y-axis direction of the arm 36, which is connected thereto through the interconnection mechanism 37.

Accordingly, when the drive motor 2 rotates, the arm 36 moves in both the Y-axis direction and the vertical direction, thereby conveying a chip on a wafer plate, not shown, onto a lead frame to be described later.

When the inching motor 10 is set in motion, the drive pulley 9 rotates relative to the second output shaft 7, and the pickup head 44 is inched in the fore-and-aft direction by an amount corresponding to the relative rotation of the drive pulley 9.

Referring to FIG. 11, when the drive motor 22 is rotated, the L-shaped plate 21 moves in the X-axis direction, and the plate 25, the arm 36 and the pickup head 44 also move in the X-axis direction together with the plate 21.

Returning to FIG. 13, when the inching motor 32 rotates, the plate 25 moves with respect to the block 27 in the vertical direction, and thus the pickup head 44 is inched in the vertical direction. This allows the pickup head 44 to accommodate lead frames of varying thicknesses.

The operations of the inching motors 10, 22 and 32 produce an inching motion of the pickup head 44 in the Y-axis, X-axis and the vertical direction, which permits a so-called scrub operation when mounting a semiconductor chip. In addition, a fine adjustment of positions where a semiconductor chip is picked up or where a semiconductor chip is mounted on a lead frame also takes place.

Referring now to FIGS. 22 to 27, a feeder 210 will be described.

Figure 22:
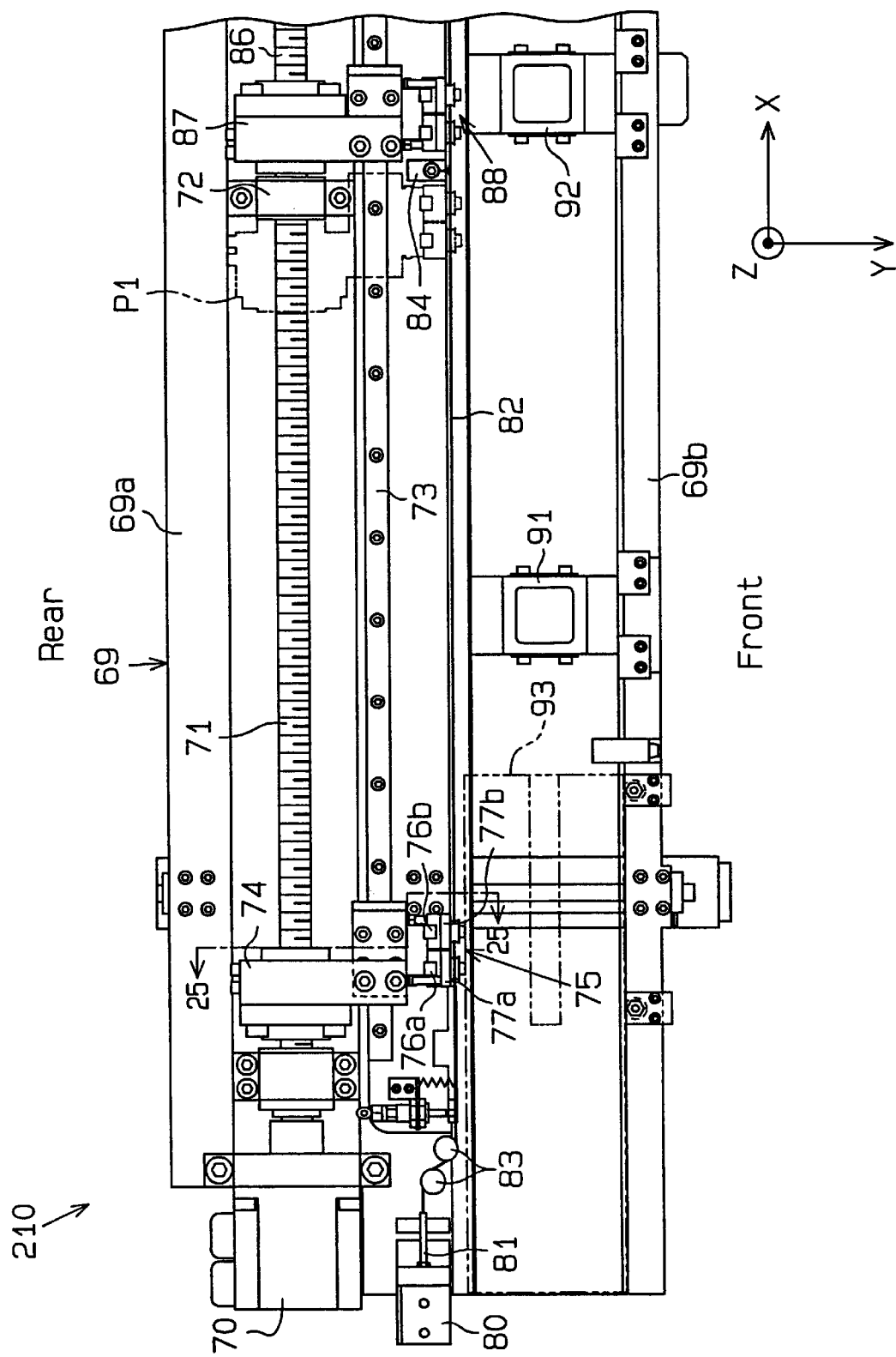
FIG. 22 is a plan view of a left end of a feeder according to one embodiment of the present invention.

In FIG. 22, the bottom of this Figure represents the front side of the feeder 21 while the top of the Figure represents the rear side of the feeder 210. The feeder 21 includes a transversely extending base 69, a rail 69a located rearward of the base 69, and a conveyor section 69b located in the forward portion of the base 69. Both the rail 69a and the conveyor section 69b extend lengthwise of the base 69.

Figure 24:
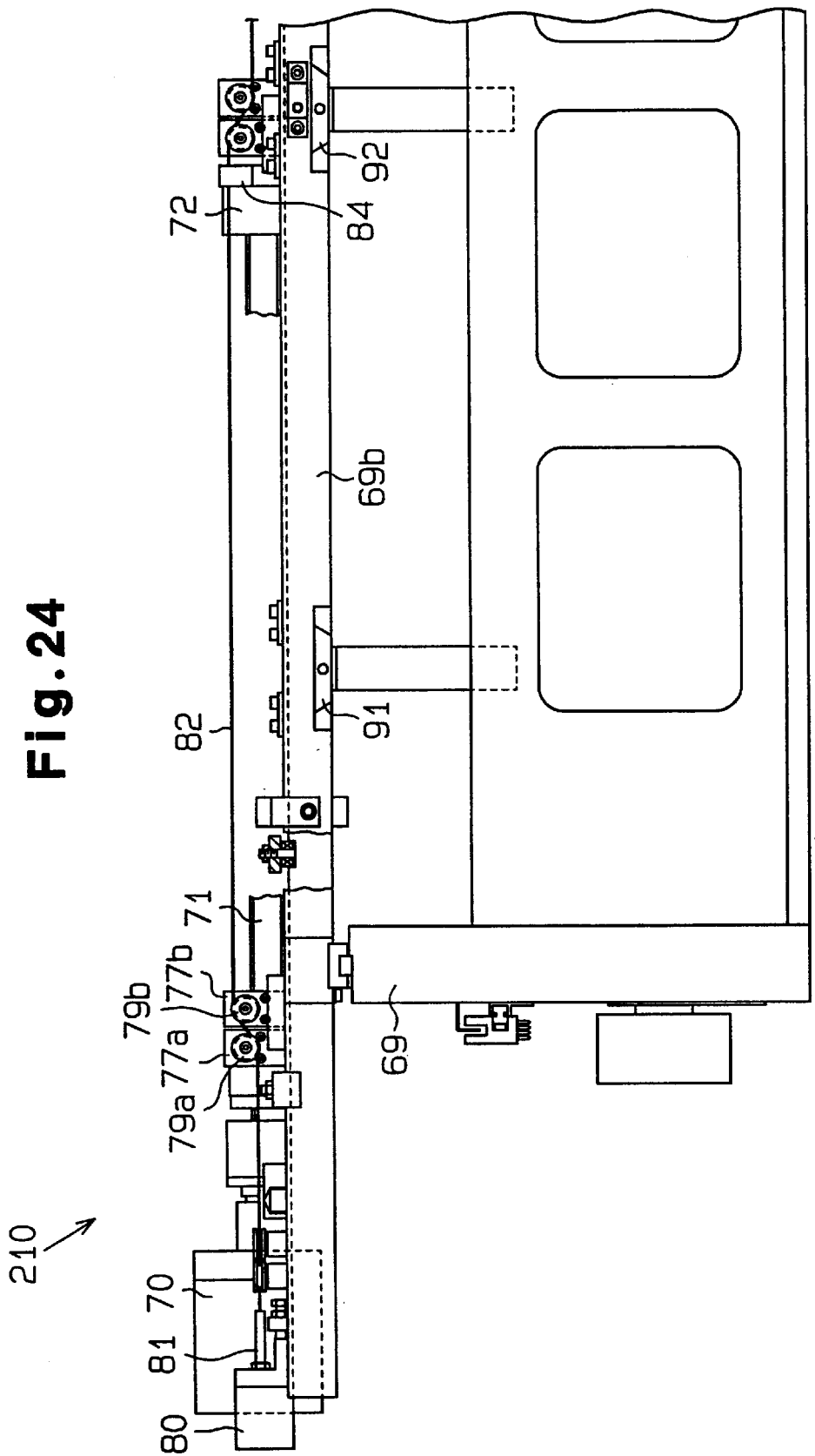
FIG. 24 is a front view of a left end of the feeder of FIG. 22.

Referring to FIGS. 22 and 24, a feed motor 70 is fixed to a left end of the rail 69a and has an output shaft connected to a feed screw 71, which extends lengthwise of the rail 69a. The feed screw 71 is supported by a bearing 72 located midway along the length of the rail 69a. A horizontal guide 73 is located forwardly of the rail 69a and extends along the rail 69a.

A carriage 74, which has threads that engage with the feed screw 71, moves along the horizontal guide 73.

Accordingly, when the feed motor 70 is rotates the feed screw 71, the cause the carriage 74 to be moved transversely, or in the X-axis direction.

A damper 75 is located forwardly of the carriage 74. Specifically, a pair of vertical guides 76a, 76b are located forwardly of the carriage 74 and extend vertically. A first block 77a, having a lower damper 75a, is connected to the left vertical guide 76a, which permits vertical movement of the first block 77a. A second block 77b, having an upper damper 75b, is connected to the right vertical guide 76b, which permits vertical movement of the second block 77b.

Figure 25:
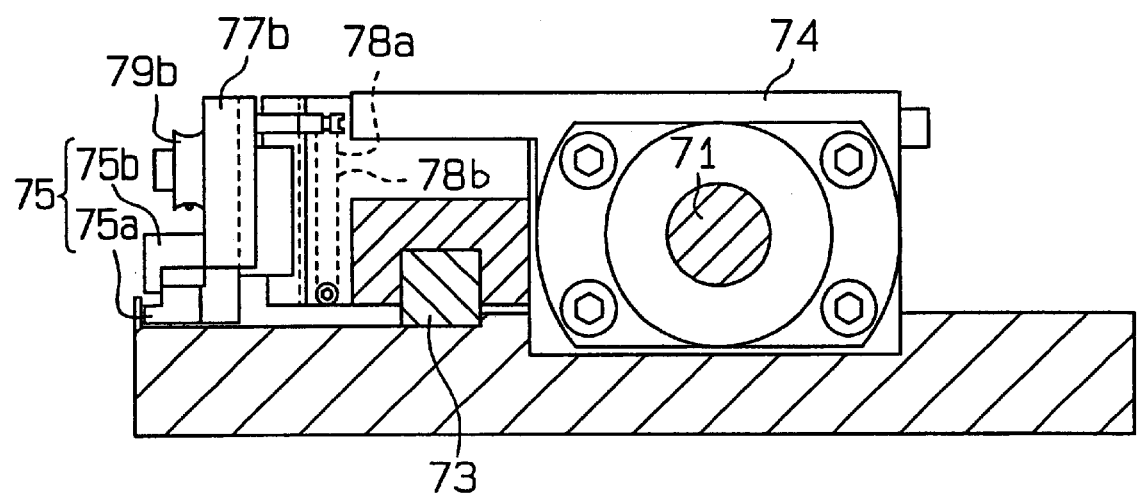
FIG. 25 is a cross sectional view taken along line 25—25 of FIG. 22.

The first block 77a is urged upward by a spring 78a (FIG. 25) while the second block 77b is urged downward by a spring 78b (FIG. 25). The front surfaces of the first and second blocks 77a, 77b rotatably carry a first and a second transmission roller 79a, 79b (FIG. 26), respectively.

Figure 26:
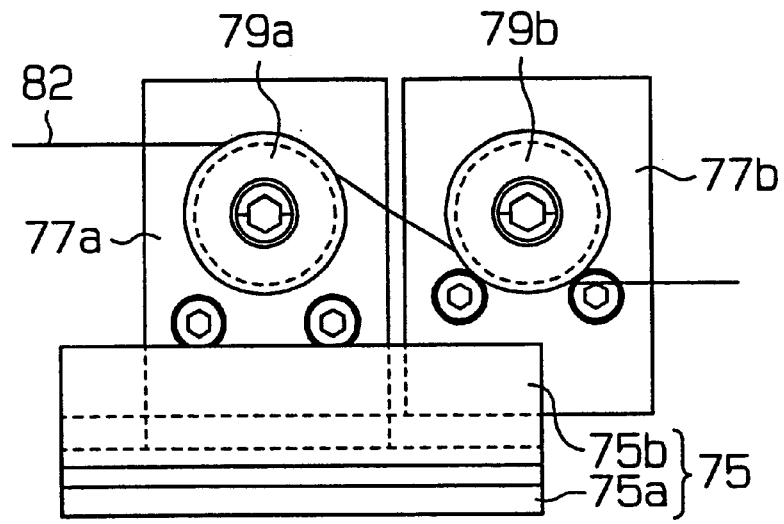
FIG. 26 is a side elevation of a clamper of the feeder of FIG. 22.
Figure 27:
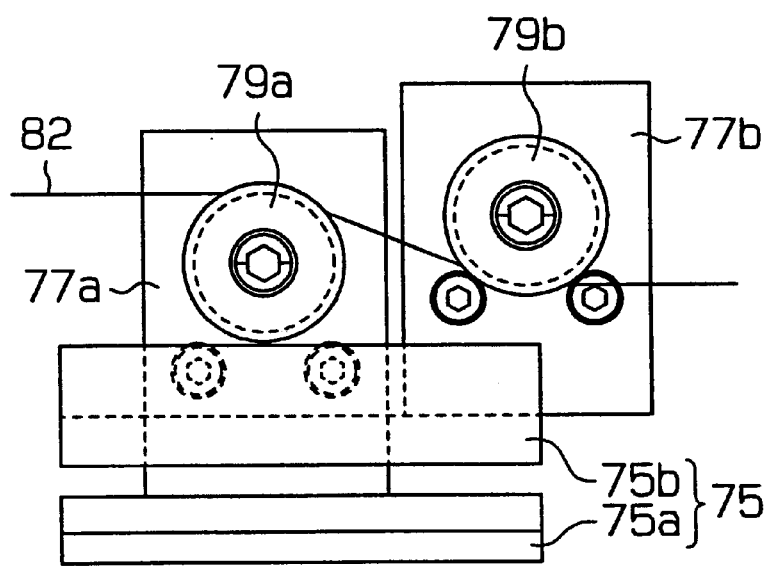
FIG. 27 is a side elevation view like FIG. 26.

A drive cylinder 80 is located on the rail 69a at a location forward of the feed motor 70. The drive cylinder 80 includes a rod 81, which is connected to one end of a transmission wire 82. The other end of the transmission wire 82 is secured to an anchorage 84 located forward of the bearing 72 after passing through a pair of stationary rollers 83. The transmission wire 82 runs substantially parallel to the feed screw 71. As shown in FIG. 26, a given tension is produced in the transmission wire 82 by its abutment against the first and second transmission rollers 79a, 79b. Under this condition, the first and second blocks 79a, 79b assume their initial positions when the upper damper 75a and the lower damper 75b abut against each other.

When the drive cylinder 80 is operated to increase the tension in the transmission wire 82 by means of the rod 81, the first block 77a is moved downward and the second block 77b is moved upward against the forces of the springs 78a, 78b, respectively, whereby the upper damper 75b and the lower 75a are separated from each other to open the damper 75. When the drive cylinder 80 is operated to decrease the tension in the transmission wire 82, the upper damper 75b and the lower damper 75a are attracted toward each other under the action of the springs 78, thus closing the damper 75. Alternatively, the damper 75 is opened or closed by allowing only one of the upper and the lower damper 75a, 75b to be operated. For example, the lower damper 75a may be fixed while the upper damper 75b may be movable. Conversely, the upper damper 75b is fixed while the lower damper 75a may be movable.

Figure 23:
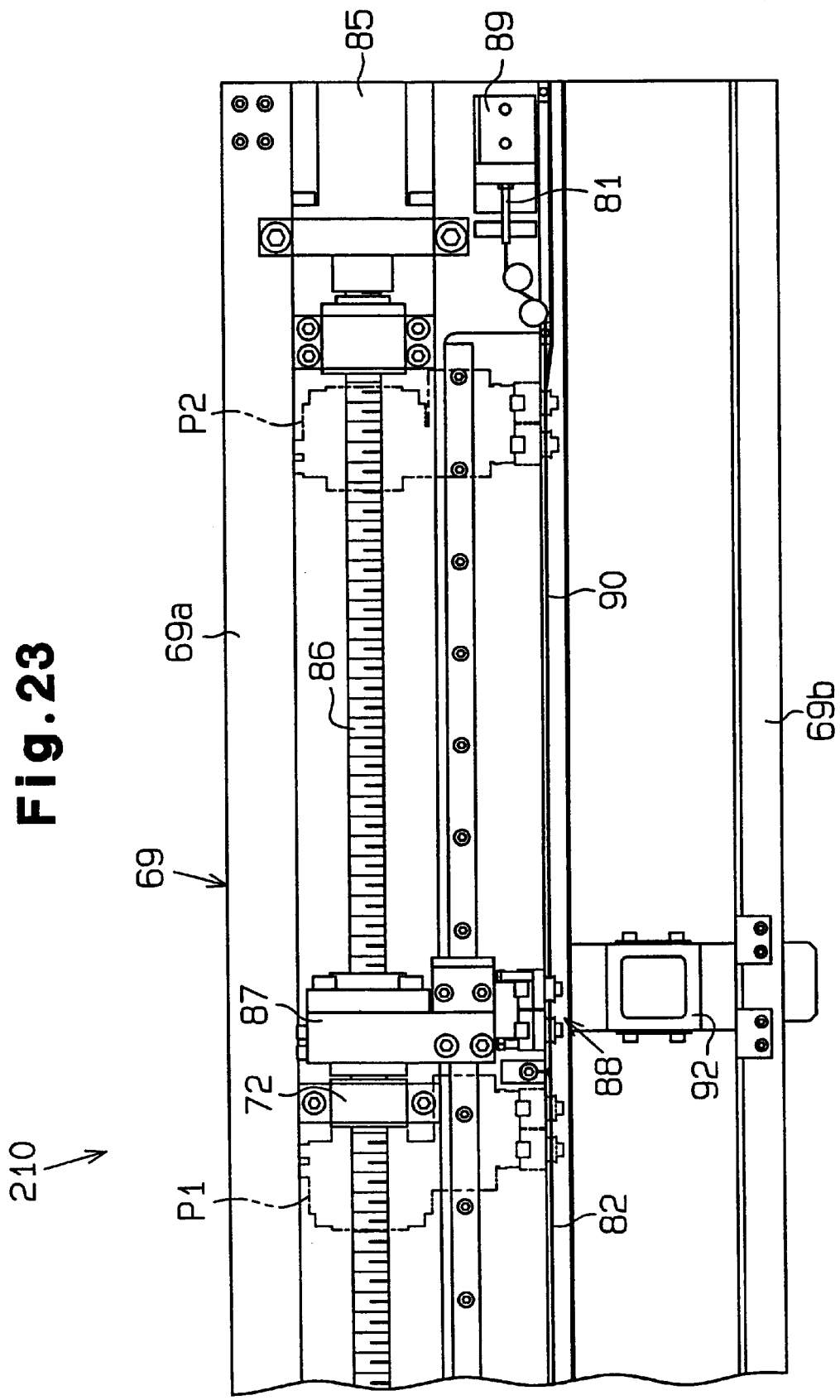
FIG. 23 is a plan view of a right end of the feeder of FIG. 22.

Referring to FIG. 23, an arrangement including a feed motor 85, a feed screw 86, a carriage 87, a damper 88, a drive cylinder 89 and a transmission wire 90 is located to the right of the bearing 72 in a similar manner to the arrangement disposed to the left of the bearing 72, or in a symmetrical manner with respect to the bearing 72, and the arrangement is associated with the rail 69a.

The operation of the feeder 210 will now be described.

When the feed motors 70, 85 are driven, the carriages 74, 87 are moved transversely. The carriages 74, 87 move relative to the transmission wires 82, 90, respectively, but because the first and second transmission rollers 79a, 79b are rotating, the tension acting upon the first and second transmission rollers 79a, 79b remains unchanged. Accordingly, the open/closed conditions of the dampers 75, 88 are maintained independently from the positions of the carriages 74, 87. The dampers 75, 88 are selectively opened or closed by the operation of the drive motors 80, 89. The feeder 210 conveys a lead frame, not shown, by controlling the opening/closing and the transverse movement of the dampers 75, 88.

A first and a second support 91, 92, which have an outer profile slightly larger than the outer profile of a semiconductor chip, are located in the conveyor section 69b. The first support 91 is located corresponding to a mid-position of the feed screw 71, and the second support 92 is located corresponding to the location of the bearing 72.

A dispenser, not shown, for feeding an adhesive material to die pads on a lead frame is located above the first support 91, and the pickup head 44 of the bonder 200 is located above the second support 92.

When a lead frame 93, shown in double-dashed phantom lines in FIG. 22, is fed to a supply position on the feeder 210, the carriage 74 causes the damper 75 to hold the lead frame 93 and then conveys it to a position above the first support 91. Then, the dispenser operates, applying the adhesive material to the lead frame 93. Subsequently, the carriage 74 conveys the lead frame 93 to a delivery position P1. The carriage 87 then operates to convey the lead frame 93 to a position P2 above the second support 92. The pickup head 44 of the bonder 200 then mounts a semiconductor chip on the lead frame 93. Subsequently, the carriage 87 conveys the lead frame 93 to a completion position.

As a result of the described construction and operation of the bonder 200 and the feeder 210 according to this embodiment, the following results are achieved.

The bonder 200 employs the wire 19a to produce the reciprocatory motion of the arm 36 in the Y-axis direction.

Because the second output shaft 7 and the drive pulley 9 are connected together through the differential output mechanism 8, the inching motion of the arm 36 and the pickup head 44 in the Y-axis direction takes place without using any guide. There is no need for special guide for the fine adjustment of the vertical position of the pickup head 44, because the relative movement of the block 27 and the plate 25 in the vertical direction provides a fine adjustment of the elevation of the pickup head 44. Accordingly, the number of guides used is reduced as compared with the conventional bonder 100, reducing the weight of the movable part on the arm 36 and permitting a higher speed of conveyance.

Since the pickup head 44 comprises the single body 44a, its weight is reduced as compared with the four bodies 128 to 131 used in the prior art arrangement.

The angle of inclination of the collet 56 is adjusted to a high precision through a simple operation of adjusting the threaded positions of the four tilting adjusting screws 55a–55d. Specifically, the bearing 54 tilts about its lower end, which serves as a fulcrum within the holding opening 44d. In other words, since the fulcrum for the tilting motion is established at a point that is located close to the collet 56, fine adjustment of the tilting of the collet 56 is achieved.

With respect to the feeder 210, the drive cylinders 80, 89, which directly drive the dampers 75, 88, are fixed outside the carriages 74, 87, thus reducing their weight as compared with the conventional carriage 134. In this manner, a higher speed of movement of the carriages 74, 87 is permitted.

Therefore, the present examples and embodiments are to be considered as illustrative and not restrictive and the invention is not to be limited to the details given herein, but may be modified within the scope and equivalence of the appended claims.

What is claimed is:

1. An apparatus for conveying of a semiconductor chip, comprising:
   an arm for conveying a semiconductor chip;
   a holder member on the arm for holding the semiconductor chip;
   a first transmission mechanism for producing power acting in a first direction;
   an interconnection mechanism for interconnecting the first transmission mechanism and the arm for causing movement of the arm in the first direction; and
   a second transmission mechanism connected to the arm for moving the arm in a second direction which is substantially orthogonal to the first direction, wherein the interconnection mechanism is rotatably connected to the arm about an imaginary axis that extends along the first direction to permit movement of the arm with respect to the first transmission mechanism in the second direction and to transmit the power from the first transmission mechanism to the arm.

2. The apparatus for conveyance according to claim 1, further comprising a drive source having an output shaft, wherein the first transmission mechanism includes:
   a drive pulley connected to the output shaft of the drive source and;
   a transmission member wrapped around the drive pulley and driven together with the drive pulley, wherein a portion of the transmission member is secured to the interconnection mechanism such that movement of the transmission member in the first direction causes movement of the interconnection member in the first direction.

3. The apparatus for conveyance according to claim 2, wherein the first transmission mechanism includes a differential mechanism between the output shaft of the drive source and the drive pulley for causing relative rotation of the drive pulley with respect to the output shaft.

4. The apparatus for conveyance according to claim 3, wherein the drive pulley rotates through a given angular range in the clockwise and the counter-clockwise directions in accordance with the rotation of the output shaft of the drive source.

5. The apparatus for conveyance according to claim 2, wherein the interconnection mechanism comprises:
   a support shaft connected to the arm and extending in the first direction;
   a lever rotatably connected to the support shaft;
   a guide piece on the lever to move in a direction substantially orthogonal to the support shaft; and
   a connection member connected to the guide piece and holding the transmission member.

6. The apparatus for conveyance according to claim 2, wherein the transmission member includes a wire.

7. The apparatus for conveyance according to claim 2, wherein the second transmission mechanism comprises:
   a support member for supporting the arm;
   a threaded shaft mounted on the support member to extend in the second direction;
   a block connected to the threaded shaft;
   a first motor mounted on the support member for rotating the threaded shaft;
   a cam connected to the output shaft of the drive source; and
   a link for permitting a movement of the block in the second direction as the cam rotates.

8. The apparatus for conveyance according to claim 7, further comprising:
   a second motor connected to the support member for moving the arm in a third direction, which is orthogonal to both the first and second directions.

9. The apparatus for conveyance according to claim 1, wherein the first direction is a horizontal direction and the second direction is a vertical direction.

10. The apparatus for conveyance according to claim 1, wherein the holding member comprises a bonding head, wherein the bonding head includes:
    a body;
    a collet supported by the body for holding a semiconductor chip;
    a pipe shaft for supporting the collet, wherein the body includes a through-opening extending vertically, for receiving the pipe shaft; and
    a regulation mechanism mounted on the body for regulating inclination of the collet, the regulation mechanism including:
       a bearing received within the through-opening in a tiltable manner for supporting the pipe shaft;
       a support formed at the lower end of the through-opening for supporting part of the bearing; and
       a plurality of holding members for applying force to the bearing in mutually different directions at locations above the support for positioning the bearing.

11. The apparatus for conveyance according to claim 10, wherein the support supports a lower end of the bearing.

12. The apparatus for conveyance according to claim 11, wherein the body includes four threaded openings extending in mutually different directions and communicating with the through opening at a location above the support, the holding members including adjusting screws, which are threaded to the threaded openings for holding the bearing.

13. The apparatus for conveyance according to claim 12, wherein three of the adjusting screws extend in a direction, orthogonal to the axis of the bearing, while the remaining adjusting screw extends at an acute angle with respect to the axis of the bearing.

14. The apparatus for conveyance according to claim 13, wherein the adjusting screws contact the bearing at equal angular intervals.

15. The apparatus for conveyance according to claim 14, wherein the ends of two of the adjusting screws abut against the bearing, while one of the adjusting screws has a conically bevelled that contacts the bearing.

16. The apparatus for conveyance according to claim 11, further comprising:
   an elevation adjusting screw threaded to the through-opening for adjusting a vertical position of the pipe shaft; and
   a stop fixed to the pipe shaft for engagement with the upper end of the elevation adjusting screw to restrict downward movement of the pipe shaft.

17. The apparatus for conveyance according to claim 16, further comprising:
   a pressure adjusting screw threaded to the pipe shaft at a location below the elevation adjusting screw; and
   a spring located between the elevation adjusting screw and the pressure adjusting screw for urging the pressure adjusting screw downward.

18. A semiconductor manufacturing system comprising:
   an apparatus for conveying a lead frame; and
   a bonder for bonding a semiconductor chip to the lead frame, the apparatus for conveyance including:
      a base extending along a particular conveying direction;
      a carriage that is movable on the base in the conveying direction;
      a first drive source for moving the carriage;
      a clamper mounted on the carriage, the damper being selectively opened and closed to hold an article to be conveyed;
      a resilient member for resiliently urging the damper to close it;
      a second drive source mounted on the base; and
      a transmission member for transmitting power from the second dive source to resilient member to open the damper against the force the resilient member;
   wherein the bounder includes:
      an arm for conveying a semiconductor chip;
      a holding member mounted on the arm for holding a semiconductor chip;
      a first transmission mechanism for producing power acting in a first direction;
      an interconnection mechanism interconnecting the first transmission mechanism and the arm for moving the arm in the first direction; and
      a second transmission mechanism connected to the arm for moving the arm in a second relation which is substantially orthogonal to the first direction, the interconnection mechanism being configured to permit a movement of the arm in the second direction relative to the first transmission mechanism and to transmit the power from the first transmission mechanism to the arm.

* * * * *